(12) United States Patent
Tsukada et al.

(10) Patent No.: US 7,453,702 B2
(45) Date of Patent: Nov. 18, 2008

(54) PRINTED WIRING BOARD

(75) Inventors: Kiyotaka Tsukada, Ogaki (JP);
Toshimasa Iwata, Ogaki (JP);
Terumasa Ninomaru, Ogaki (JP);
Takamichi Sugiura, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 271 days.

(21) Appl. No.: 11/253,734

(22) Filed: Oct. 20, 2005

(65) Prior Publication Data

US 2006/0049509 A1    Mar. 9, 2006

Related U.S. Application Data

(63) Continuation of application No. PCT/JP2004/008721, filed on Jun. 21, 2004.

(30) Foreign Application Priority Data

Jun. 30, 2003   (JP)   .............. 2003-186063

(51) Int. Cl.
*H05K 1/18* (2006.01)
*H05K 1/16* (2006.01)

(52) U.S. Cl. ............ 361/760; 361/761; 361/766; 174/260; 174/261

(58) Field of Classification Search ......... 174/260–261; 361/760–766
See application file for complete search history.

(56) References Cited

U.S. PATENT DOCUMENTS

| | | | | |
|---|---|---|---|---|
| 3,801,388 A | * | 4/1974 | Akiyama et al. | 216/20 |
| 4,296,272 A | * | 10/1981 | Schelhorn | 174/256 |
| 4,437,140 A | * | 3/1984 | Ohyama et al. | 361/765 |
| 4,544,989 A | * | 10/1985 | Nakabu et al. | 361/764 |
| 4,682,414 A | * | 7/1987 | Butt | 29/840 |
| 5,144,536 A | * | 9/1992 | Tsukada et al. | 361/765 |
| 6,204,454 B1 | * | 3/2001 | Gotoh et al. | 174/255 |

(Continued)

FOREIGN PATENT DOCUMENTS

| | | |
|---|---|---|
| JP | 4-147695 | 5/1992 |
| JP | 09-139608 | 5/1997 |
| JP | 10-79561 | 3/1998 |
| JP | 10-135608 | 5/1998 |
| JP | 11-4056 | 1/1999 |

OTHER PUBLICATIONS

DuPont, DuPont Electronic Materials, Printed Board Built-In Elements, Feb. 15, 2002, disclosed at the internet address of http://www.dupont.co.jp/mcm/apri/print/ER.html.

*Primary Examiner*—Cathy Lam
(74) *Attorney, Agent, or Firm*—Oblon, Spivak, McClelland, Maier & Neustadt, P.C.

(57) ABSTRACT

A printed wiring board comprises the insulating layer 11 (12); at least one resistance element $31_1$ ($31_2$) comprising a metal as a main component has 0.5 to 5 μm of a roughened surface in an arithmetic means height in the one surface, in −Z direction, and 5% to 50% of the arithmetic mean height in average thickness, which is embedded close to a surface on one side of the insulating layer 11 and a conductive pattern wired surface is composed of the one surface of the resistance element and the one side of the insulating layer 11; and the conductive pattern $35_1$ ($35_2$), arranged on the conductive pattern wired surface, is connected to the terminal of the resistance element $31_1$ ($31_2$). With this structure, it is provided the printed wiring board comprising the resistance element having an accurate and stable resistance value in a broader resistance value range.

13 Claims, 17 Drawing Sheets

U.S. PATENT DOCUMENTS 6,219,253 B1 * 4/2001 Green .................... 361/761
6,281,090 B1 8/2001 Kukanskis et al.
6,542,379 B1 * 4/2003 Lauffer et al. ............... 361/793
6,555,208 B2 * 4/2003 Takada et al. ............... 428/209
6,707,681 B2 * 3/2004 Suzuki et al. ............... 361/761
7,034,231 B2 * 4/2006 Kukanskis et al. .......... 174/260

* cited by examiner

PRINTED WIRING BOARD

RELATED APPLICATION

This is a continuation application of the international patent application No. PCT/JP2004/008721 filed with Application date: Jun. 21, 2004.

BACKGROUND OF THE INVENTION

The present invention relates to a printed wiring board and, more particularly, to a printed wiring board containing resistance elements.

BACKGROUND ART

Conventionally, a printed wiring board containing resistance elements has been put into practical use. Resistance elements contained in this printed wiring board are formed by screen printing, etching, and plating.

In screen printing, resistance elements are formed by, e.g., the following method (see, the patent reference 1). At first, an insulator material layer and a conductor material layer are laminated, and desired conductive patterns are formed on the insulator layer by photoetching. Subsequently, an undercoat layer is formed between the predetermined conductive patterns formed on the insulator layer. Carbon paste is then screen-printed on a surface, which is composed of the undercoat layer and the conductive patterns arranged adjacent to the undercoat layer, so as to cover a part of that of the conductive pattern to form resistance elements. In this manner, resistance elements to be comprised in a printed wiring board are formed (to be referred to as "the prior art 1" hereinafter). Note that it is also possible to directly coat resin, the insulator layer, with paste without forming any undercoat.

As a formation method of resistance elements formed by screen printing, a method is also known; wherein, on a copper foil, the resistance elements are formed by screen printing using ink containing, e.g., $LaB_6$, to be covered by an insulator layer, and then the copper foil is etched to form desired conductive patterns (see the non-patent reference 1, to be referred to as "the prior art 2" hereinafter).

In the etching, resistance elements are formed by, e.g., the following method (see the patent reference 2). Firstly, an insulator material layer, resistance material layer, and conductive material layer are laminated, and the first photoresist corresponding to the shape of a desired resistance element is formed on the conductive material layer, and then the conductive material layer is removed by subtractive etching, remaining the first photoresist on the pattern. Thereby, the resistance material layer remained on the region wherein the conductor layer is subtractively removed, is subtractively removed. Then, after the first photoresist is removed, the first photoresist corresponding to the shape of desired conductive patterns is formed, and etching is performed to subtractively remove the conductive material layer. In this way, the resistance elements being comprised in the printed wiring board are formed (to be referred to as "the prior art 3" hereinafter).

In the plating, the resistance element is formed by, e.g., the following method (see the patent reference 4). Firstly, an insulator material layer and conductive material layer are laminated, and desired conductive patterns are formed on the insulator layer by photoetching. Subsequently, the resistance elements are formed by plating between the predetermined conductive patterns formed on the insulator material layer. When the resistance element is formed, the plating is performed to cover the surface of the insulating layer between the predetermined conductive patterns and a part of that of the predetermined conductive patterns. In this manner, the resistance elements comprised in a printed wiring board are formed (to be referred to as "the prior art 4" hereinafter).

Patent Reference 1: Japanese Patent Publication No. H11 (1999)-4056

Patent Reference 2: Japanese Patent Publication No. H04 (1992)-147695

Patent Reference 3: U.S. Pat. No. 6,281,090

Non-patent Reference 1: DuPont, "DuPont Electronic Materials, Printed Board Built-In Elements, [online], 2002.2.15, [Searched 2003, Apr. 16, ], Internet <ULR:http://www.dupont.cojp/mcm/apri/print/ER.html>

SUMMARY OF THE INVENTION

The techniques disclosed in the prior arts 1 to 4 described above are superior in a viewpoint that the resistance elements comprised in the printed wiring board can be easily formed. However, when the resistance elements formed by using the technique of screen printing as in the prior arts 1 or 2, to be also referred to as "printed resistance elements" hereinafter, the liquid paste flows after printing, the thickness or width of the printed resistance element varies depending on shrinkage during thermal cure of the resin, an adhesive agents, and so forth, and the shape of the element readily changes by spreading. As a consequence, the resistance value cannot be accurately controlled. In addition, the resistance value readily changes affected by heat applied during a surface treatment, or heat and pressure applied when another layer is laminated on the resistance element via a prepreg, and this often causes increased variations. Also, in the technique of the prior art 1, since resin components remain in the resistance element, it is difficult to maintain a stable resistance value, because the resistance value is drifted under heat generated by a substrate or various electronic components while these electronic components are mounted on a printed wiring board and actually used. In the technique of the prior art 2, the resistance element is formed by sintering $LaB_6$ at high temperatures, and followed by the volume shrinkage of the resistance element. Therefore, $LaB_6$ partially adheres to the surface of the copper foil, but it often insufficiently follow to the copper foil surface. For example, the strength of the bond in the region in which $LaB_6$ and the copper foil surface are adhered readily decreases affected by heat applied after the resistance elements are formed or by liquid chemicals such as acids or alkalis used during the elements are formed. Accordingly, the resistance value of the resistance element can be neither controlled to a desired value nor be maintained in a stable resistance value by using the technique disclosed in the prior art 1 or 2.

In the prior art 3, the conductive material layer is etched twice, and the resistance material layer is etched once, i.e., etching is performed three times in total. In the prior art 3, that is, the first etching is performed on the conductive material layer to remove the layer on regions except for prospective resistance element regions of the resistance layer. Then the exposed regions of the resistance material layers are removed by etching to form necessary resistance elements. However, when this resistance material layer is etched, the side surfaces of those regions on the resistance element material layer, which are present below the conductor layer regions not removed by the first etching, and which function as resistance elements to be finally formed, are also etched. As a result, this caused the decrease of the width of the resistance element to be finally formed.

By the technique of the prior art 3, therefore, the resistance value of the built-in resistance element cannot be accurately controlled to a desired value. Note that in the prior art 3, in order to prevent the corrosion on the upper surface of the resistance element, which causes a larger decrease of the resistance value in accuracy than that caused by corrosion on the side surfaces, an etching solution which does not corrode the resistance material is used in the second etching of the conductor layer. In the prior art 3, however, the side surfaces of the resistance element are corroded by etching as described above, and it is difficult to form a resistance element with long in length and fine in width that capable of obtaining a high resistance value.

In the prior art 4, regions having steps such as the insulating layer and conductive patterns must be plated. In this case, a photosensitive dry film is laminated or liquid resist mask is coated, and then openings are formed on the film or mask by photo-etching. In the exposure of photoetching, since there is the difference between the conductive patterns and the insulating layer, it is difficult to form the openings accurately, particularly, these to be formed on the insulating layer with sufficient accuracy. Also, in the prior art 4, the interface between the conductor and the resistance element bends at a substantially right angle. Accordingly, when thermal stress is applied in a heat treatment step performed later or in actual usage, therefore, the interface is readily cracked and is makes difficult to maintain a stable resistance value. Furthermore, since the resistance elements must be formed in interstices between the conductive patterns, it is difficult to freely form the shape of the resistance element.

The present invention has been made in consideration of the above situation, and has as its object to provide a printed wiring board containing the built-in resistance elements having an accurate resistance value, which is stable over a broad resistance value range.

A printed wiring board of the present invention is a printed wiring board comprising: an insulating layer; at least one resistance element comprising a metal as a main component, having a roughened surface as a surface on one side, having an average thickness which is from 5% to 50% of an arithmetic mean height of the roughened surface, and embedded in a surface on the one side of the insulating layer; and a conductor pattern arranged on a surface, which is composed of the surface on the one side of the insulating layer and the surface of the one side of the resistance element, and on which the conductor pattern is wired, and connected to a terminal portion of the resistance element.

In this printed wiring board, the surface on the one side of the resistance element is roughened, and the average thickness is from 5% to 50% of the arithmetic mean height (Ra) of the surface on the one side. Thereby, the resistance element capable of having a long current path between the conductive patterns that connected to each end of the resistance element, to be also referred to as "electrodes" hereinafter, and ensuring the average thickness confers the stability as the resistance element. That is, the resistance element with low resistance value superior in the stability and accuracy in the resistance value may be obtained, when the resistance element has a wide current path in width, a short current path in length in the planar shape, and is thick such as the thickness not larger than 50% of the arithmetic mean height (Ra) of the surface on the one side of the resistance element as its upper limit. Alternatively, the resistance element with high resistance value superior in the stability and accuracy in the resistance value may be obtained, when the resistance element has a narrow current path in width, long current path in length in the planar shape, and is thin such as the thickness not less than 5% of the arithmetic mean height (Ra) as its lower limit.

The arithmetic mean height (Ra) is generally used as a scale of the surface roughness, and is an amount defined by JIS B 0601-2001 (in conformity to ISO4287-1997).

In this printed wiring board, the resistance element is mounted close to the surface on the one side of the insulating layer, and the one surface of the resistance element forms the conductive pattern wired surface, which is composed of the one side of the surface of the resistance element and the one side of the insulating layer. Therefore, even when the conductive layer such as copper foil is arranged on the conductive pattern wired surface to form conductive patterns by photo-etching and the like, the side surfaces of the resistance element are not eroded by the etching solution.

Also, in this printed wiring board, since the average thickness of the resistance element is not higher than 50% of the arithmetic means height (Ra), the roughness of the surface on the one side of the resistance element, the surface on another side of the resistance element to be contact to the insulating layer is also roughened. Accordingly, the resistance element and the insulating layer are connected with high adhesion.

Furthermore, in this printed wiring board, the surface on the one side of the resistance element is in contact with the surface on another side of the electrode. As a consequence, since the electrode and resistance element are connected in a large area, the connection may be maintained even if the printed wiring board expands or contracts by heat. Also, since the resistance element and the electrode are not bent in the connections, stress is not easily concentrated to the connections in this structure. By the structure, the reliability of the connection strength is improved. In addition, even when the printed wiring board is bent, it is possible to prevent the resistance element or electrode from fracture caused by the bent.

Accordingly, the printed wiring board of the present invention can provide a printed wiring board comprising a resistance element having a stable and accurate resistance value in a broader range.

Also, in this printed wiring board, the roughened surface has an arithmetic mean height from 0.5 to 5 µm. It is easy to roughen the surface of the resistance element so as to fall the arithmetic mean height within this range. Therefore, a resistance element superior in stability may be formed.

In the printed wiring board of the present invention, as a main component of the resistance element, it is used at least one metal selected from the group consisting of nickel, cobalt, chromium, indium, lanthanum, lithium, tin, tantalum, platinum, iron, palladium, vanadium, titanium, and zirconium; among them, the metal selected from the group consisting of nickel, chromium, or iron is preferably used. By using these metals, the resistance element having a variety of the resistance value and less fluctuation of the resistance value at high temperatures may be produced.

The resistance element may be formed by a nickel alloy containing 5% to 15% of phosphorus to the total weight of the resistance element.

Alternatively, in the printed wiring board of the present invention, a protective film made of an etching resistant material may be arranged on the surface on the one side of the resistance element. In this case, the erosion on the surface on the one side of the resistance element, which is caused by etching to form the conductive patterns, may be reduced. Accordingly, a printed wiring board comprising a resistance element having more accurate resistance value may be provided.

Note that in the printed wiring board of the present invention, the resistance elements may be formed by a variety of methods such as plating, CVD, and PVD, and the plating is preferably employed, because dense and strong films may be formed.

As explained above, the printed wiring board of the present invention achieves the effect that it provides a printed wiring board comprising resistance elements having a stable and accurate resistance value in the broader range.

DETAILED DESCRIPTION

An embodiment of the present invention is described below with reference to FIGS. 1 to 10.

Figure 1:
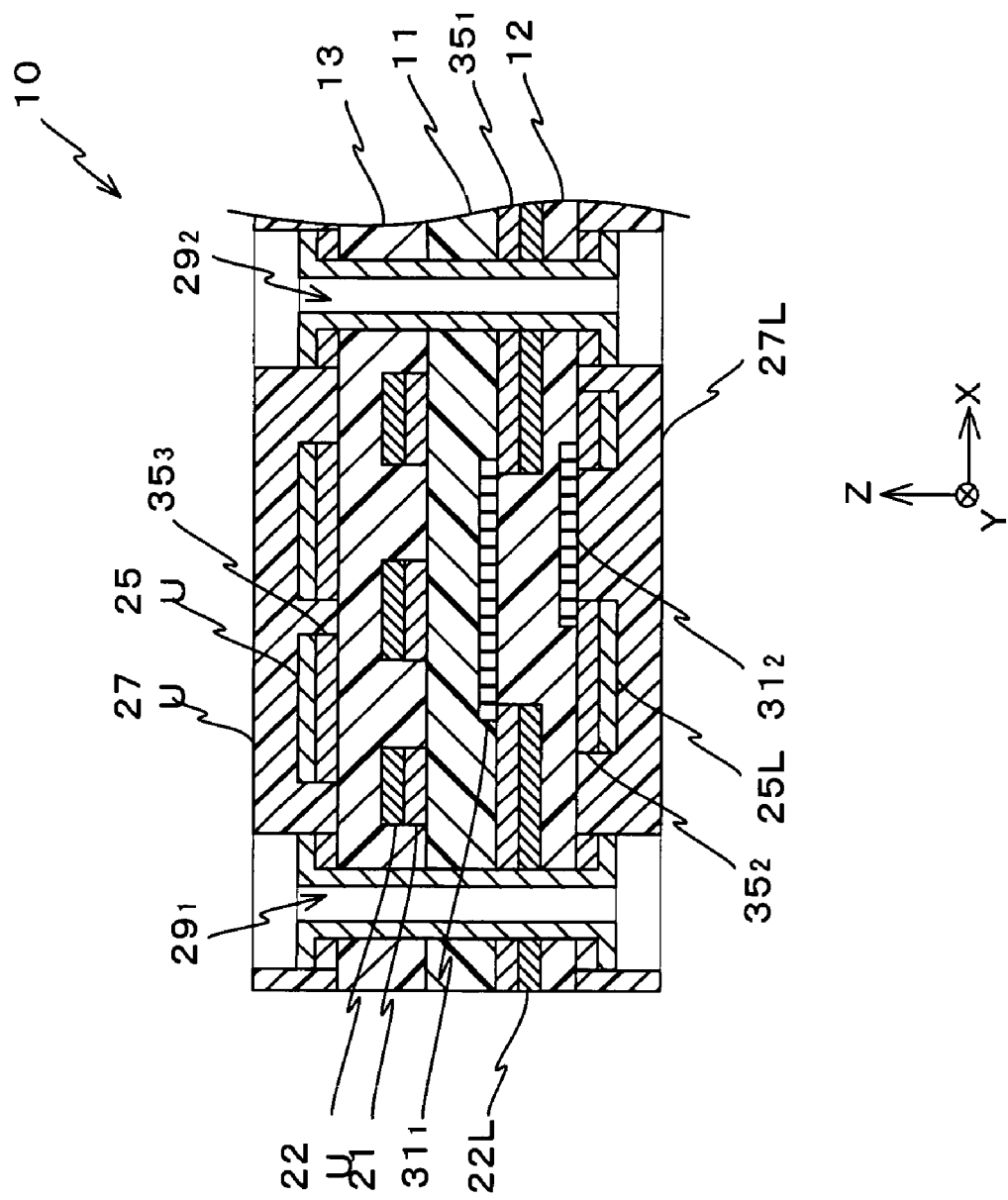
FIG. 1 is a sectional view showing a schematic arrangement of an embodiment of the printed wiring board according to the present invention.

FIG. 1 shows the sectional view along with X-Z axis of the constitution of a printed wiring board 10 according to the embodiment of the present invention. The printed wiring board 10 comprises two resistance elements.

As shown in FIG. 1, the printed wiring board 10 comprises (a) the insulating layer 11, and (b) conductive patterns (to be referred to as "the conductive patterns 21 and 22U" hereinafter), wherein the conductive patterns 21 and 22U are formed on the surface in the +Z direction of the insulating layer 11 on which the conductive patterns 21 and 22U are formed along and sequentially laminated. The conductive patterns 21 and 22U have the same shape in X-Y plane.

The printed wiring board 10 also comprises (c) the insulating layer 13 formed on the surface in the +Z direction of the surface composed of the insulating layer 11 and the conductive patterns 21 and 22U, and (d) the conductive patterns (to be referred to as "the conductor pattern $35_3$ and 25U" hereinafter) formed on the surface in the +Z direction of the insulating layer 13 on which the conductive patterns $35_3$ and 25U are formed along and sequentially laminated. The conductive patterns $35_3$ and 25U have the same shape in X-Y plane.

In addition, the printed wiring board 10 comprises (e) the resistance element $31_1$ as the first resistance element embedded close to the surface in the −Z direction of the insulating layer 11, (f) conductive patterns (to be referred to as "the conductive patterns $35_1$ and 22L" hereinafter) formed on the surface in the −Z direction, of which surface is composed of the surface in the −Z direction of the insulating layer 11 and that of the resistance elements $31_1$ to form the conductive pattern wired surface; wherein the conductive patterns $35_1$ and 22L are sequentially laminated and wired along with the conductive pattern wired surface in the −Z direction, and (g) the insulating layer 12 formed on the surface which is composed of the surface in the −Z direction of the insulating layer 11, that of the resistance element 31₁, and these of the conductive patterns 35₁ and 22L. The conductive patterns 35₁ and 22L have the same shape in X-Y plane.

Furthermore, the printed wiring board 10 comprises (h) the resistance element 31₂ as the second resistance element embedded close to the surface in the −Z direction of the insulating layer 12, and (j) the conductive patterns (to be referred to as "the conductive patterns 35₂ and 25L" hereinafter) formed on the conductive pattern wired surface in the −Z direction, which is composed of the surface in the −Z direction of the insulating layer 12 and that in the −Z direction of the resistance elements 31₂; wherein the conductive patterns 35₂ and 25L are sequentially laminated on and wired along with the conductive pattern wired surface in the −Z direction. The conductive patterns 35₂ and 25L have the same shape in X-Y plane.

The printed wiring board 10 also comprises (k) via holes 29₁ and 29₂ for interlayer wiring, which extend through the printed wiring board 10 in the Z-axis direction. Respective inner walls of the via holes 29₁ and 29₂; are covered by a conductor layers, and in both ends in the +Z and −Z directions of the via holes 29₁ and 29₂, the conductive patterns to form land patterns are arranged. Note that the conductor layer on the inner walls and the conductive patterns to form the land patterns of each via holes 29₁ and 29₂ are electrically connected.

Additionally, the printed wiring board 10 comprises (m) the solder mask 27U formed on the surface which is composed of the surface in the +Z direction composed of the insulating layer 13 and that of the conductive patterns 35₃ and 25U, and (n) the solder mask 27L formed on the surface which is composed of the surface in the −Z direction of the insulating layer 12 and that of the conductive patterns 35₂ and 25L. Note that the solder mask 27U is neither formed on the land pattern in the +Z direction of the via holes 29₁ nor 29₂; the solder mask 27L is not formed on the land pattern in the −Z direction of each of the via holes 29₁ and 29₂.

As the material for the insulating layers 11, 12, and 13, there are mentioned, for example, epoxy resin, an impregnated cloth by impregnating epoxy resin or polyimide into a glass cloth (to be sometimes referred to as "glass epoxy" or a "prepreg" hereinafter); among them, the glass epoxy is preferably used, because it has superior in dimensional stability, mass-productivity, and thermal stability. Note that the insulating layers 11, 12, and 13 may be formed by using the same or different materials as mentioned above.

As the material for the conductive patterns 21, 22, for example, there are mentioned, for example, conductive metals such as copper, aluminum, and stainless steel, and among them, copper is favorably used, because it is superior in processability.

Figure 2A:
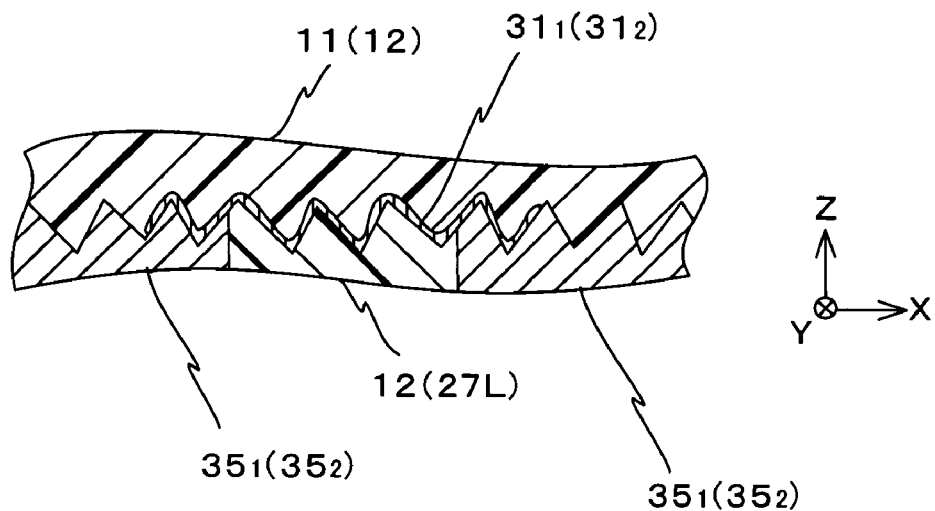
FIG. 2A is a view for explaining the shape of the first and the second resistance elements shown in FIG. 1.
Figure 2B:
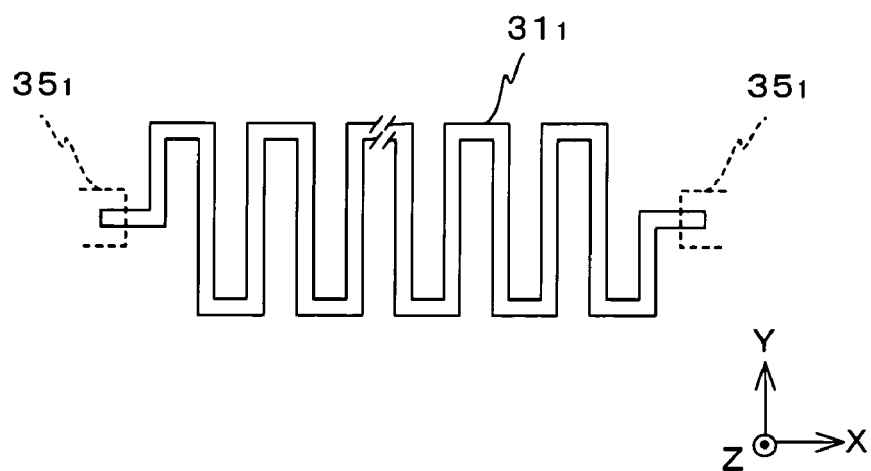
FIG. 2B is a view for explaining the shape of the first resistance element shown in FIG. 1.
Figure 2C:
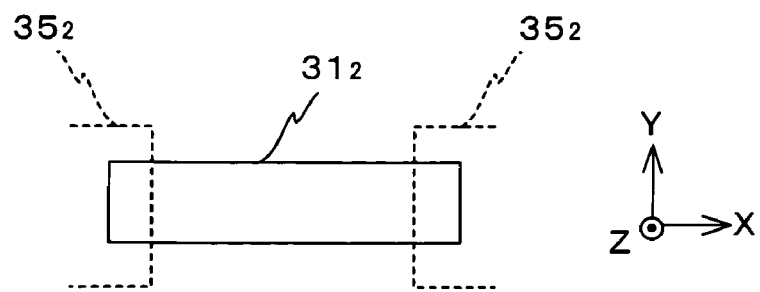
FIG. 2C is a view for explaining the shape of the second resistance element shown in FIG. 1.

FIG. 2 schematically shows the arrangements of the resistance elements 31₁ and 31₂ used in the production of the printed wiring board 10. FIG. 2A shows the X-Z sectional view of the resistance element 31ⱼ (j=1 or 2) and its periphery, such that the surface roughness of the resistance element 31ⱼ is emphasized. FIG. 2B shows an example of the planar shape of the resistance element 31₁ having a high resistance value; FIG. 2C shows an example of the planar shape of the resistance element 31₂ having a low resistance value.

As shown in FIG. 2A, in equality is entirely formed on the both surfaces in the +Z and −Z directions of the resistance element 31ⱼ. The arithmetic mean height (Ra) of the surface in the −Z direction of the resistance element 31ⱼ is from 0.5 to 5 μm. The thickness in the Z-axis direction of the resistance element 31ⱼ is from 5% to 50% of the arithmetic mean height (Ra).

As a main component of the resistance element 31ⱼ it is preferably used at least one metal selected from the group consisting of nickel, cobalt, chromium, indium, lanthanum, lithium, tin, tantalum, platinum, iron, palladium, vanadium, titanium, and zirconium; among them, the metal selected from the consisting of nickel, chromium, and iron is favorably used in particular due to the following two reasons. At first, the above-mentioned metals are not readily oxidized even at high temperatures of 200° C. or more. In second, since these metals have a relatively high resistivity of 5 μΩcm or more (to be sometimes referred to as "high-resistivity metals" hereinafter), and relatively readily alloy with other metals except them, alloys with variety in resistivities may be obtained. For example, when an alloy is formed by using metals copper or aluminum or other metal having a resistivity of 5 μΩcm or less (to be sometimes referred to as "low-resistivity metals" hereinafter), the alloy having a high corrosion resistance can be effectively obtained without extremely decreasing the resistivity, if the ratio of these low-resistivity metals is less than 10 wt % of the whole alloy weight.

The thickness of the resistance element 31ⱼ is from 5% to 50% of the arithmetic mean height (Ra) based on the following reasons: in general, a thin resistance elements gives a high resistance in thickness, however, the thickness of the resistance element less than 5% of the arithmetic mean height (Ra) lower the strength so that the resistance element with a long current path having a stable resistance value can not be obtained. In contrast, the thickness of the resistance element over the 50% makes inequality on the roughened surface flat; the resistance element with a high resistance cannot be obtained, and adhesion properties to the insulating layer 11 (12) become lower. Alternatively, when the arithmetic mean height of the roughened surface is from 0.5 to 50 μm, the surface of the resistance element described above is readily roughened to improve the stability and resistance in accuracy.

The pattern of the planar shape of the resistance element 31₁ shown in FIG. 2B is a mianda pattern having a pattern of 50 μm in width and about 100 mm in length, assuming that the pattern is formed on a flat plane in this embodiment. Note that in this embodiment, the resistance element 31₁ has an average thickness of 0.2 μm in the Z-axis direction.

The pattern of the planar shape of the resistance element 31₂ shown in FIG. 2C is a rectangular pattern having a pattern of 100 μm in width and 500 μm in length, assuming that the pattern is formed on a flat plane in this embodiment. Note that in this embodiment, the resistance element 31₂ has an average thickness of 0.4 μm in the Z-axis direction.

The resistance element 31ⱼ may be formed by, e.g., plating, CVD, or PVD; however, plating is most preferably used, because it forms dense and strong films. When plating is performed, electrodepositing or electroless plating is appropriately used depending on the composition of the resistance element 31ⱼ. For a plating bath, plating solutions appropriately prepared by dissolving plural metals or alloys comprising these metals as mentioned above may be preferably used.

Among plating methods, a method using a nickel-plating bath (to be referred to as "the nickel plating" hereinafter) can be most preferably used. In particular, it is preferable to add 5 to 15 wt % of phosphorus to the total weight of the metals and phosphorus to this nickel-plating bath. The content of phosphorus limit within this range based on the following reasons. The phosphorus content less than 5 wt % readily forms pinholes in the resistance element, and the resistance value easily changes. Also, since the bonding strength between nickel crystals is small, the corrosion resistance against heat or against a liquid chemical such as an acid or alkali often decreases. In contrast, the phosphorus content excess 15 wt % readily generates oxidization of phosphorus in nickel by oxygen, and this leads the resistance value change when the resistance element is used in a high-temperature air atmosphere.

The production steps of the printed wiring board 10 are explained in below.

Figure 3A:
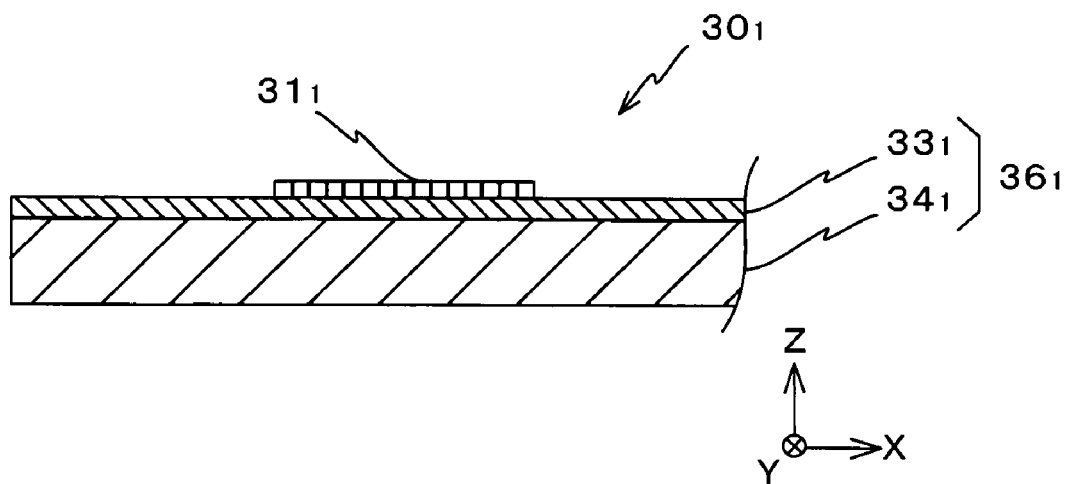
FIG. 3A is a view showing a schematic arrangement of the first resistance element module used for the production of the printed wiring board shown in FIG. 1.
Figure 3B:
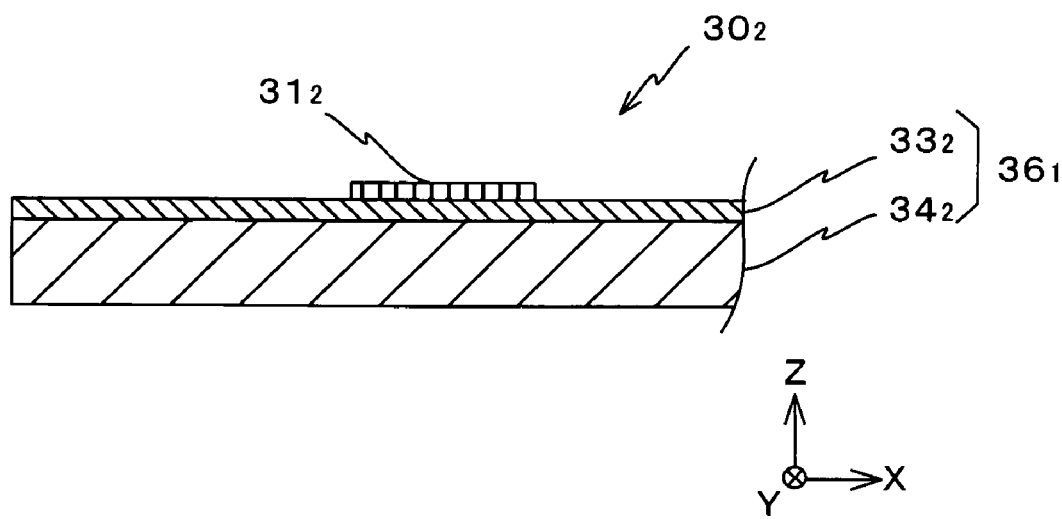
FIG. 3B is a view showing the schematic arrangement of the second resistance element module used for the production of the printed wiring board shown in FIG. 1.
Figure 16:
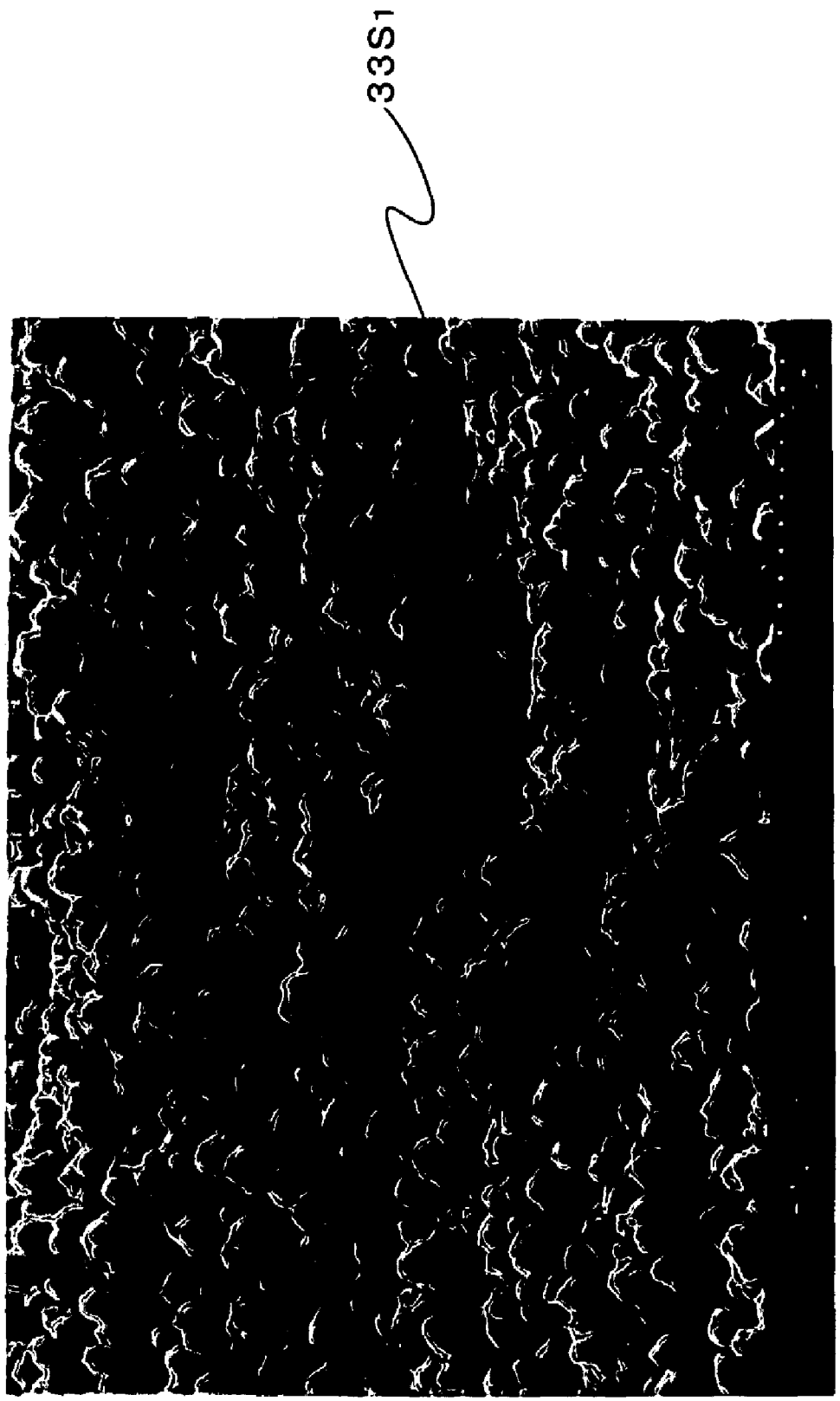
FIG. 16 is a photograph substituted for drawing, showing a surface $33S_1$ of a copper foil, conductive film $33_1$ by photomicrograph.

At first, the resistance element module $30_1$ shown in FIG. 3A and the resistance element module $30_2$ shown in FIG. 3B are produced. The resistance element module $30_i$ comprises (i) the carrier with the conductive film $36_1$ which is made by laminating the conductive film $33_1$ such as a copper film on the surface in the +Z direction of a support member $34_1$ (to be sometimes referred to as a "carrier member" or a "carrier" hereinafter), and (ii) the resistance element $31_1$ formed on the surface in the +Z direction of the conductive film $33_1$. The surface in the +Z direction of the conductive film $33_1$ is roughened to have a predetermined value of the arithmetic mean height (Ra). FIG. 16 shows an electron micrograph of the roughened surface $33S_1$ of the conductive film $33_1$.

Figure 17:
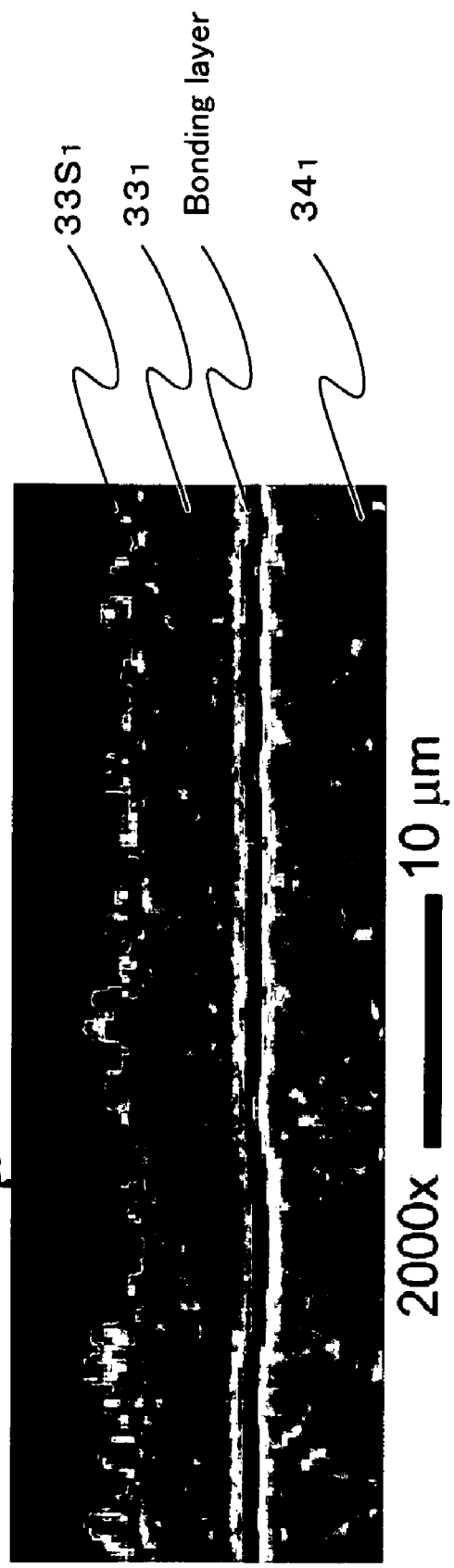
FIG. 17 is a photograph substituted for drawing, showing the section of the copper foil, conductive film $33_1$ by photomicrograph.

The carrier with the conductive film $36_1$ may also be produced by contact bonding the conductive film $33_1$ onto the surface in the +Z direction of the support member $34_1$, and a commercially available product may also be appropriately chosen and used. Examples of the commercially available product are Micro-Thin (Mitsui Mining & Smelting. Co., Ltd.), XTR (Olin Brass Corporation), and UTC-Foil (MET-FOILS AB). As an example of the carrier with the conductive film $36_1$, a microphotograph of the sectional view of Micro-Thin (Mitsui Mining & Smelting. Co., Ltd.) is shown in FIG. 17. This carrier with the conductive film is obtained by adhering the conductive film $33_1$ to the carrier $34_1$ via an adhesive layer.

The resistance element module $30_2$ comprises (i) the carrier with the conductive film $36_2$ obtained by laminating the conductive film $33_2$ similar to the conductive film $33_1$ on the surface in the +Z direction of a support member $34_2$ similar to the support member $34_1$, and (ii) the resistance element $31_2$ formed on the surface in the +Z direction of the conductive film $33_2$.

Similar to the carrier with the conductive film $36_1$, the carrier with the conductive film $36_2$ may also be produced by contact bonding the conductive film $33_2$ onto the surface in the +Z direction of the support member $34_2$, and a commercially available product may also be appropriately chosen and used. Examples of the commercially available product are the same as those of the carrier with the conductive film $36_1$.

Figure 4A:
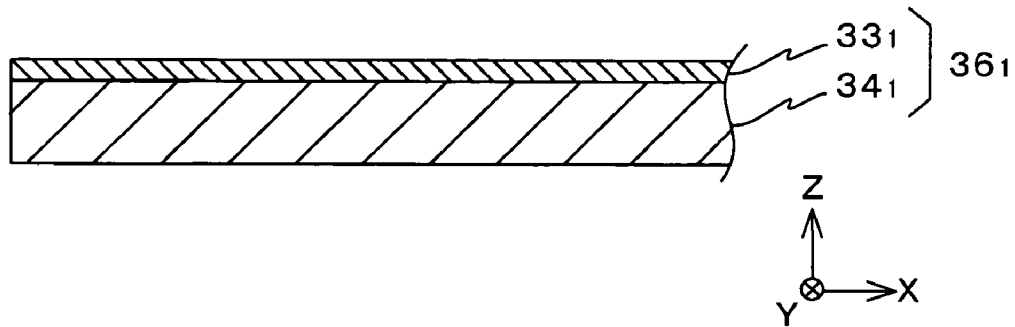
FIG. 4A is a view (No. 1) for explaining a production step of the resistance element module shown in FIG. 3A.
Figure 4B:
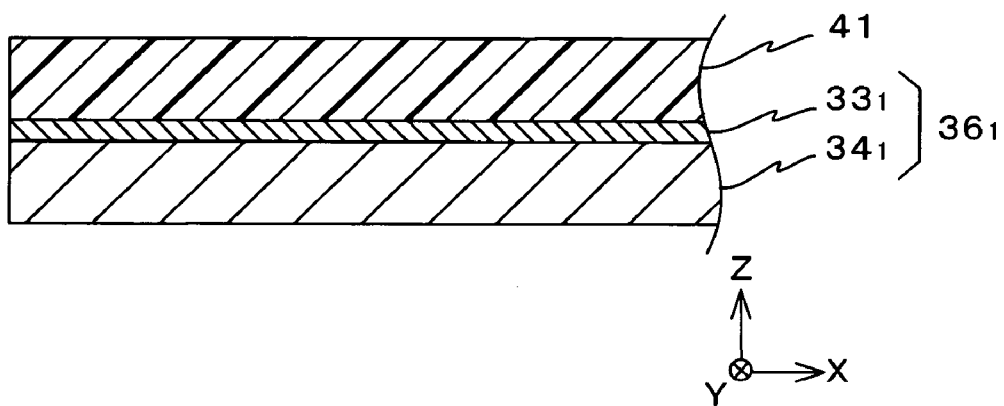
FIG. 4B is a view (No. 2) for explaining the production step of the resistance element module shown in FIG. 3A.

In the production of the resistance element module $30_1$, the carrier with the conductive film $36_1$ is firstly prepared (see FIG. 4A). Subsequently, the surface in the +Z direction of the conductive film $33_1$ is coated with a liquid photoresist to form the dry photoresist layer 41 (see FIG. 4B). As the liquid photoresist for forming the dry photoresist layer 41, for example, PER-20 (TAIYO INK MFG. CO., LTD.) and so forth may be used.

Figure 4C:
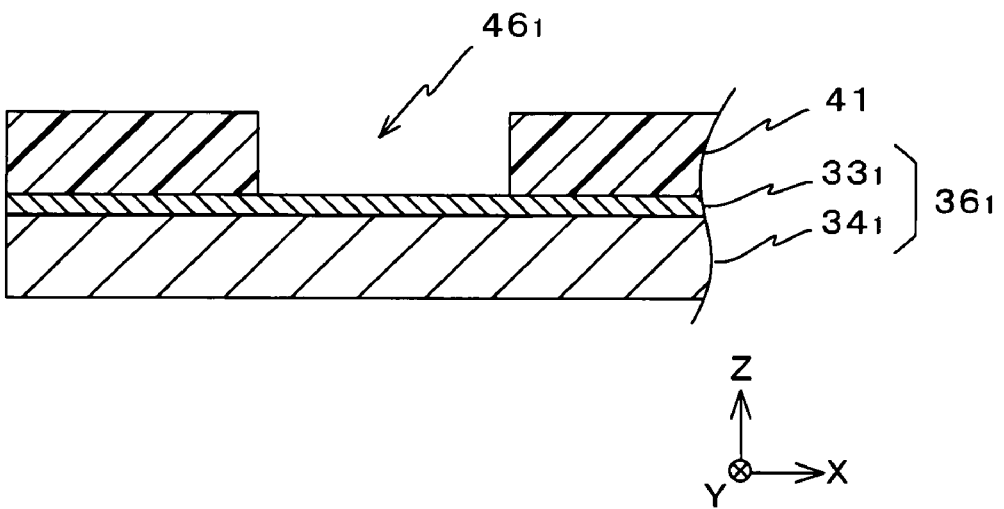
FIG. 4C is a view (No. 3) for explaining the production step of the resistance element module shown in FIG. 3A.

Then, the recess $46_1$ is formed by removing the dry photoresist layer 41 on a prospective resistance element region, thereby exposing the surface in the +Z direction of the conductive film $33_1$ in the prospective resistance element region in a desired size (see FIG. 4C). The dry photoresist on the resistance element region is removed by using well-known photolithography method or the like.

Then, the resistance element $31_1$ is formed on the conductive film $33_1$ exposed as described above, by using a method such as plating which uses a plating bath having a desired composition, PVD, and CVD. When plating is used, the resistance element $31_1$ having a desired plating thickness, i.e., a desired resistance value may be formed by appropriately adjusting the plating bath composition and plating conditions (pH, a temperature, and a current density and power supply time of electroplating, if it is performed) (see FIG. 5A). For example, the resistance element having an average thickness of 0.20 μm may be formed by plating for 1 minute under predetermined conditions, e.g., at 40° C. to 60° C., for 1 minute, the current density of approximately 2 to 6 A/dm², by using the nickel sulfate bath (pH 4 to 5) having the following composition.

TABLE 1

| Composition of nickel electroplating bath | (g/L) |
| --- | --- |
| Nickel sulfate | approx. 300 |
| Nickel chloride | approx. 50 |
| Boric acid | approx. 40 |

Figure 5A:
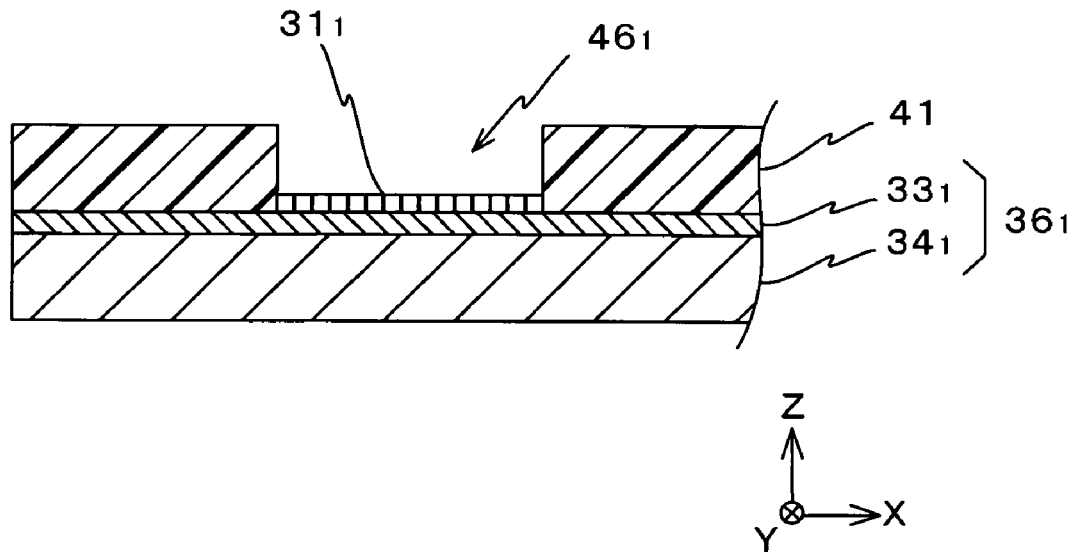
FIG. 5A is a view (No. 4) for explaining the production step of the resistance element module shown in FIG. 3A.
Figure 5B:
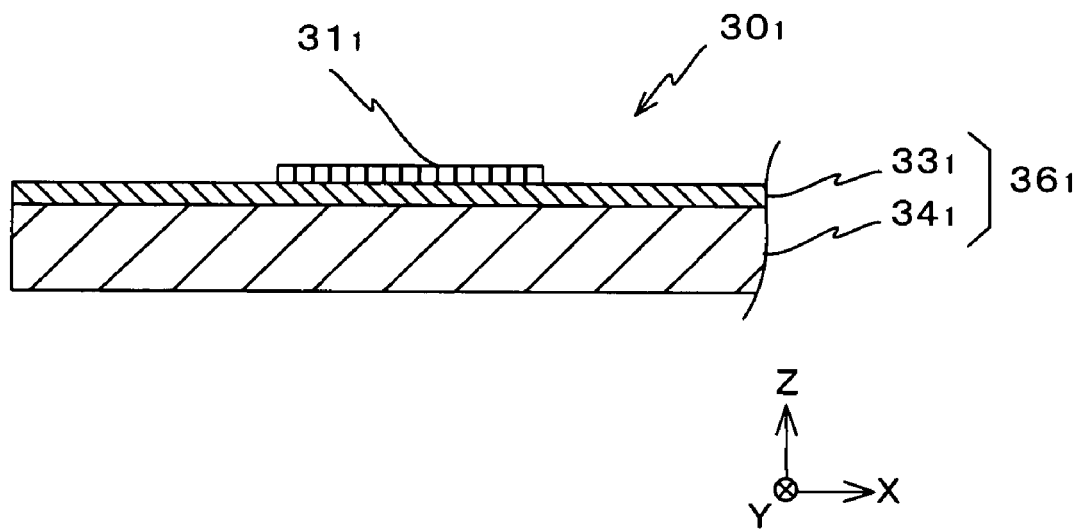
FIG. 5B is a view (No. 5) for explaining the production step of the resistance element module shown in FIG. 3A.

Subsequently, the dry photoresist $41_1$ is removed from the surface in the +Z direction of the conductive film $33_1$ (see FIG. 5B). In this manner, the resistance element module $30_1$ is produced.

The resistance element module $30_2$ is produced in the same manner as the resistance element module $30_1$.

Note that in the formation of the dry photoresist layer 41, a method for laminating a dry film photoresist can be used. As an example of the dry film photoresist, there mentioned, for example, HW440 (Hitachi Chemical Co., Ltd) and the like.

In addition, as the plating method, electroless plating using the plating bath shown in Table 2 may be also used.

TABLE 2

| Composition of electroless plating nickel-phosphorus bath | (g/L) |
| --- | --- |
| Nickel sulfate | 21-26 |
| Sodium hypophosphite | 16-21 |
| Sodium acetate | approx. 25 |
| Sodium citrate | approx. 15 |
| Sulfuric acid | appropriate amount |

Note that resistance elements having different resistance values may be obtained by forming a plurality of recesses $46_i$, or the resistance elements $31_1$ and $31_2$ may also be obtained by depositing gold, silver, chromium, iron, vanadium, or the like on the surfaces in the +Z direction of the conductive films $33_1$ and $33_2$, utilizing a deposition method such as physical vapor deposition (PVD) or chemical vapor deposition (CVD).

Figure 6A:
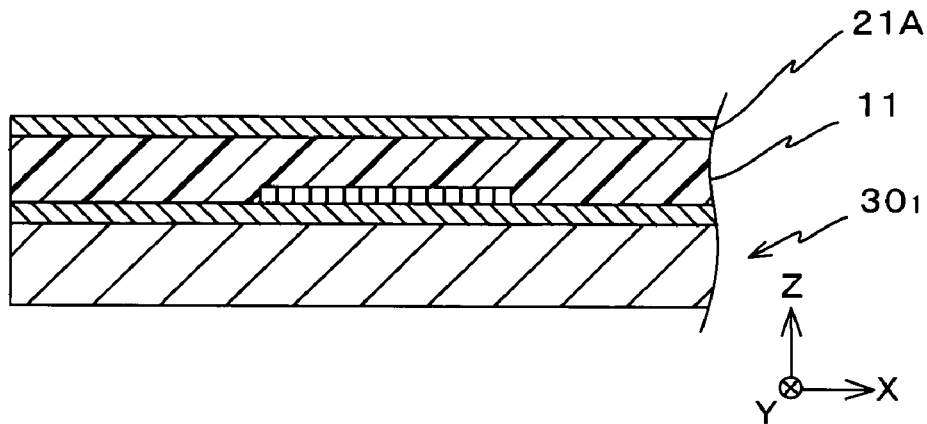
FIG. 6A is a view (No. 1) for explaining the production step of the printed wiring board shown in FIG. 1.

On the surface in the +Z direction of the resistance element module $30_j$ produced as described above, an insulating member is arranged, and then the +Z direction of this insulating member is covered by the conductive film 21A to treat them under predetermined conditions, for example, at 185° C. and 40 kg/cm² for 1 hour, thereby sequentially laminating the insulating layer 11 and the conductive film 21A along the +Z direction (see FIG. 6A). As a consequence, the resistance element $31_1$ is mounted close to the surface in the −Z direction of the insulating layer 11. As examples of the insulating member 11, there are mentioned prepreg such as GEA-67N (Hitachi Chemical Co., Ltd) and R1661 (Matsushita Electric Works, Ltd.). The conductive film 21 A is made of similarly material to the conductive films $33_1$ and $33_2$ described above.

Figure 6B:
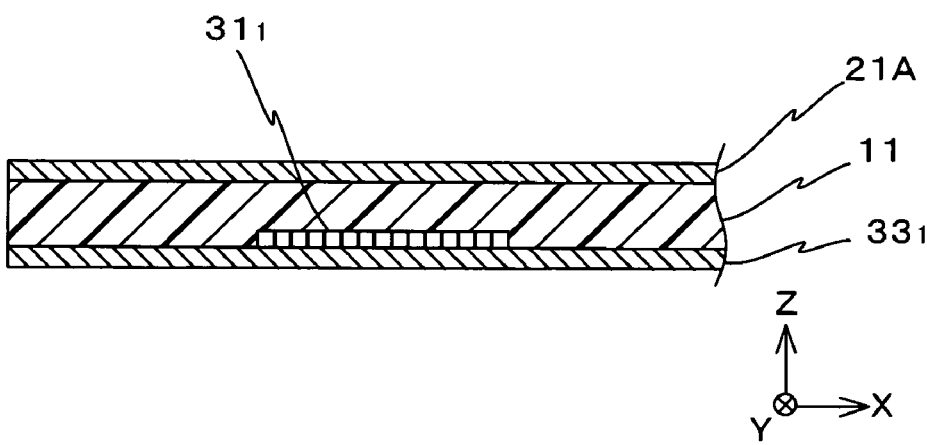
FIG. 6B is a view (No. 2) for explaining the production step of the printed wiring board shown in FIG. 1.

After that, the carrier member $34_1$ is removed (see FIG. 6B).

Figure 6C:
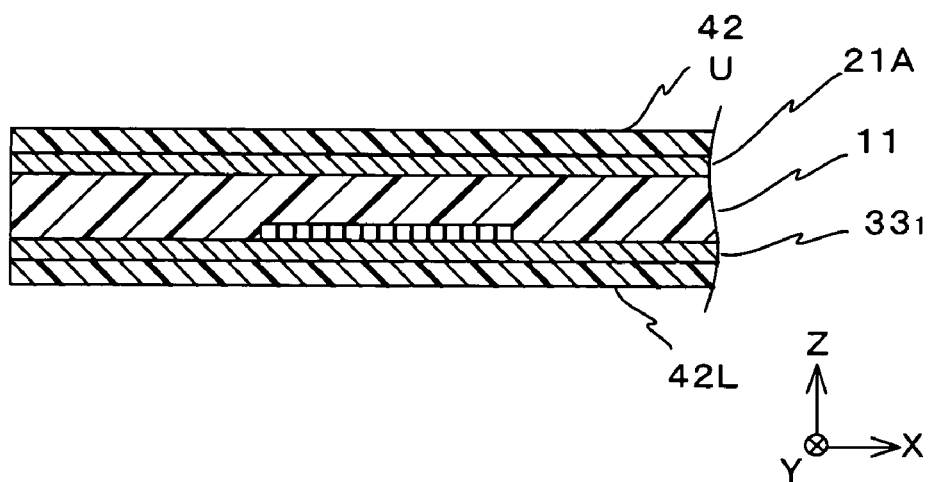
FIG. 6C is a view (No. 3) for explaining the production step of the printed wiring board shown in FIG. 1.

Then, the dry film resist 42U is laminated on the entire surface in the +Z direction of the conductive film 21A, and the dry film photoresist 42L is laminated in the −Z direction of the conductive film $33_1$ (see FIG. 6C).

Figure 7A:
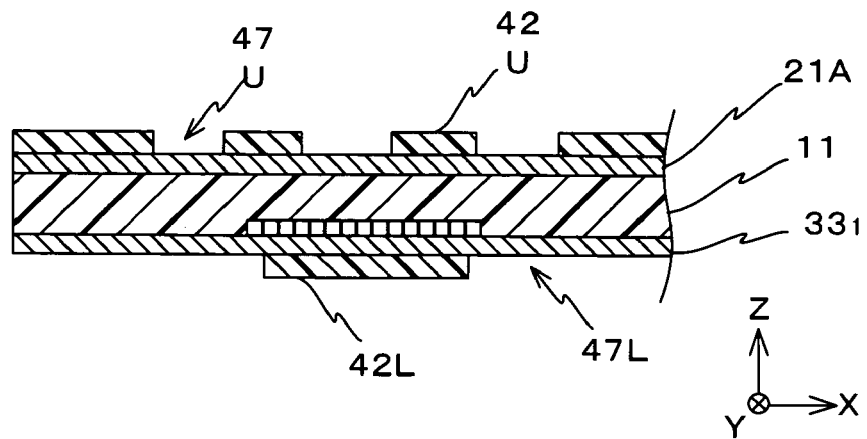
FIG. 7A is a view (No. 4) for explaining the production step of the printed wiring board shown in FIG. 1.

By using well-known photolithography, the recess 47U is formed by removing the photoresist from regions, where the conductive pattern 21 described earlier should be formed, on the surface in the +Z direction of the conductive film 21a; the recess 47L is formed by removing the photoresist from the regions, where the conductive pattern 22 described earlier should be formed, on the surface in the −z direction of the conductive film 42L (see FIG. 7A).

Figure 7B:
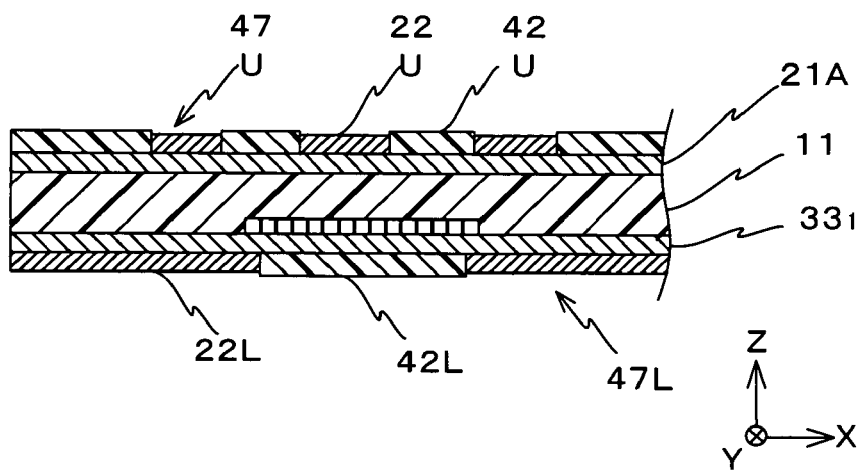
FIG. 7B is a view (No. 5) for explaining the production step of the printed wiring board shown in FIG. 1.
Figure 7C:
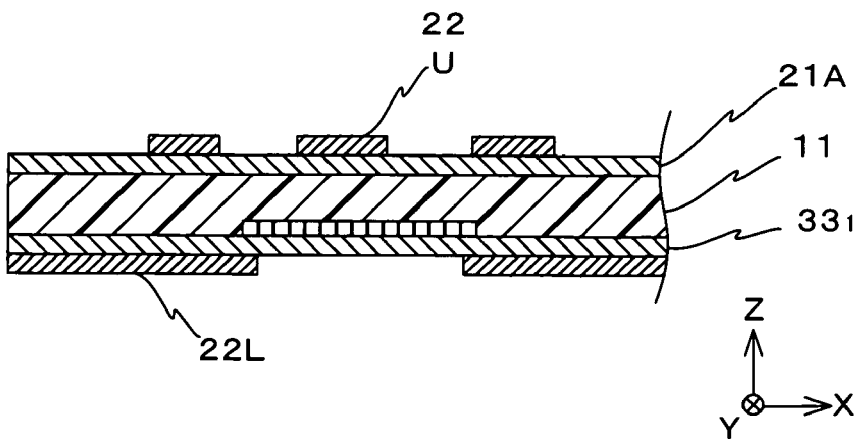
FIG. 7C is a view (No. 6) for explaining the production step of the printed wiring board shown in FIG. 1.

The recesses 47U and 47L are then plated so as to have a desired thickness plate by using a desired solution, thereby forming the conductive patterns 22U and 22L (see FIG. 7B). Subsequently, the dry film photoresist 42U is removed (see FIG. 7C).

Then, the photoresist 43U is formed by coating the entire surfaces in the +Z direction of the conductive film 21A and the conductive pattern 22U with the photoresist agent. Also, the photoresist 43L is formed by coating the entire surfaces in the −Z direction of the conductive film $33_1$ and the conductive pattern 22L with the photoresist agent (see FIG. 8A). Subsequently, the photoresist 43U and 43L are removed from regions except for the regions of the conductive patterns 22U and 22L formed by well-known photolithography, thereby exposing the conductive films 21A and $33_1$ in these regions (see FIG. 8B).

In the +Z direction of the insulating layer 11, the conductive film 21A in the exposed regions is etched away until the surface in the +Z direction of the insulating layer 11 is exposed. In the −Z direction of the insulating layer 11, the conductive film $33_1$ in the exposed regions is etched away until the surface in the −Z direction of the insulating layer 11 and the surface in the −Z direction of the resistance element $31_1$, is exposed. In this way, the member 50 is obtained, in which the resistance element $31_1$ is mounted close to the surface in the −Z direction of the insulating layer 11, the conductive patterns 21 and 22U are formed on the surface in the +Z direction of the insulating layer 11, and the conductive patterns $33_1$ and 22L are formed on the surface composed of that in the −Z direction of the insulating layer 11 and that of resistance element $31_1$ (see FIG. 8C). Since the X-Z and Y-Z surfaces of the resistance element $31_1$ are embedded in the insulating layer 11, they are not corroded by etching. Consequently, the resistance element $31_1$ which is formed according to the designed values and is comprised in the resistance element module $30_1$ through the production step, is implemented in the member 50 while the resistance value is accurately maintained.

Subsequently, the conductive patterns 21 and 22U and conductive patterns $33_1$ and 22L are subjected to the black oxide treatment in order to improve the both adhesion of the conductive patterns 21 and 22U to the insulating layer 13 to be formed later, and the adhesion of the conductive patterns $33_1$ and 22L to the insulating layer 12 to be formed later. In the black oxide treatment, the surfaces of the conductive patterns 21 and 22U and conductive patterns $33_1$ and 22L are treated with an alkali solution.

Then, the insulating layer 13 is formed on the surface in the +Z direction of the member 50. The insulating layer 13 may be formed by using the same material as that used to form the insulating layer 11 described above, or other materials. On the other hand, the insulating layer 12 is formed on the surface in the −Z direction of the member 50. The insulating layer 12 may be formed by the same material as the insulating layer 13.

On the surface in the +Z direction of the insulating layer 13, the carrier with the conductive film $36_3$, which is formed in the same manner as the carrier with the conductive film $36_1$ described earlier, is laid over such that the conductive film $33_3$ contact to the surface in the +Z direction of the insulating layer 13. On the other hand, on the surface in the −Z direction of the insulating layer 12, the resistance element module $30_2$ is laid over such that the resistance element $31_2$ contact to the surface in the −Z direction of the insulating layer 12 (see FIG. 9A).

Subsequently, under the desired conditions, such as at approximately 185° C., approximately 40 kg/cm², and for 1 hour, the member 50 is pressed and then the support members $34_3$ and $34_2$ are peeled off to form the laminate 51 (see FIG. 9B).

Figure 10A:
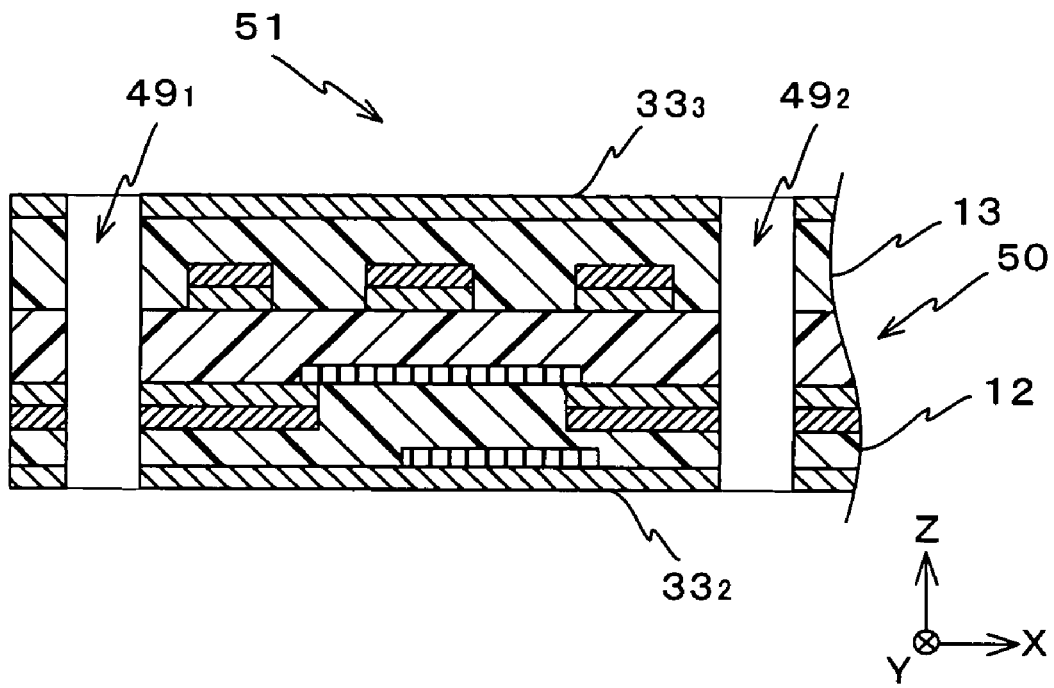
FIG. 10A is a view (No. 12) for explaining the production step of the printed wiring board shown in FIG. 1.
Figure 10B:
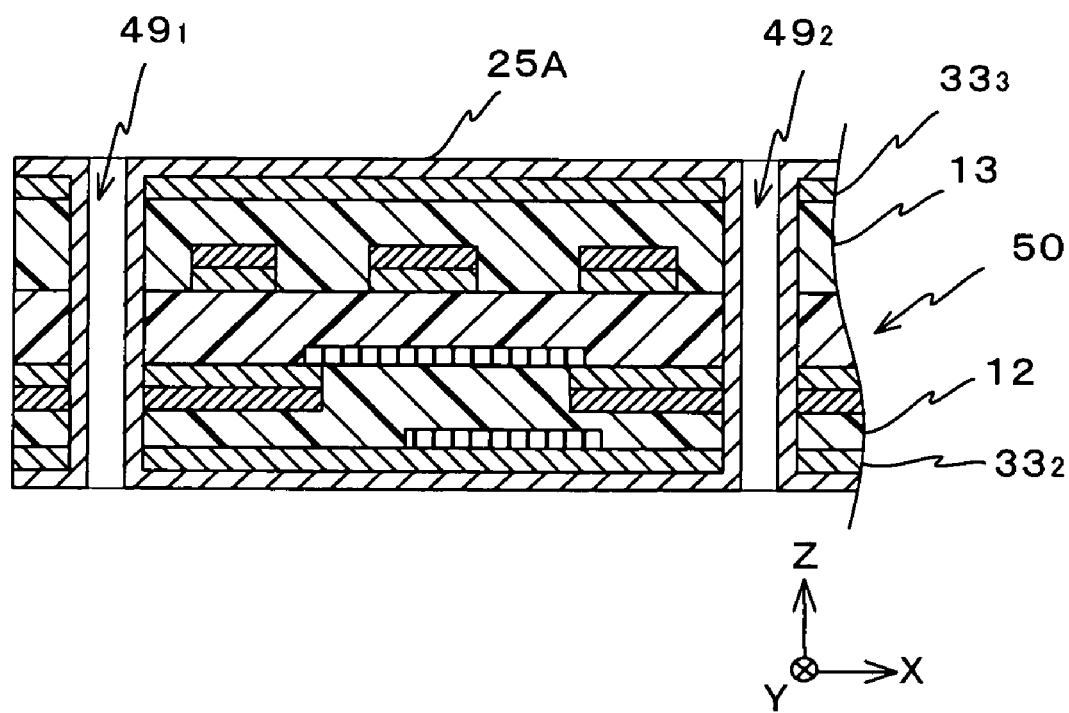
FIG. 10B is a view (No. 13) for explaining the production step of the printed wiring board shown in FIG. 1.

Then, through holes $49_1$ and $49_2$ are formed in the laminate 51 by using a drill and the like (see FIG. 10A). Subsequently, the entire surfaces in the +Z and −Z directions of the laminate 51 and the inner walls of the both through holes $49_1$ and $49_2$ are entirely plated under desired conditions, e.g., by a plating method using the plating bath shown in Table 3, to be presented later, thereby forming the plating film 25A. More specifically, the thickness of the plating film 25A may be controlled to approximately 15 μm by forming a plating film having 1 to 2 μm in thickness of chemical copper and 13 to 14 μm in thickness of electrolytic copper (see FIG. 10B).

Subsequently, the dry film photoresist 44U is laminated on the entire surface in the +Z direction of the plating film 25A including the terminal in the +Z direction of the through holes $49_1$ and $49_2$. Also, the dry film photoresist 44L is laminated on the entire surface in the −Z direction of the plating film 25A including the terminal in the −Z direction of the through holes $49_1$ and $49_2$ (see FIG. 11A). Well-known photolithography is then performed to remove the dry film photoresist 44U on the terminal in the +Z direction of the through holes $49_1$ and $49_2$ and on regions except for regions of the conductive patterns $35_3$ and 25U described previously, as well as the dry film photoresist 44L on the terminal in the −Z direction of the through holes $49_1$ and $49_2$ and on the regions except for the regions of the conductive patterns $35_2$ and 25L described previously, thereby exposing the plating film 25A in these regions (see FIG. 11B).

Figure 12A:
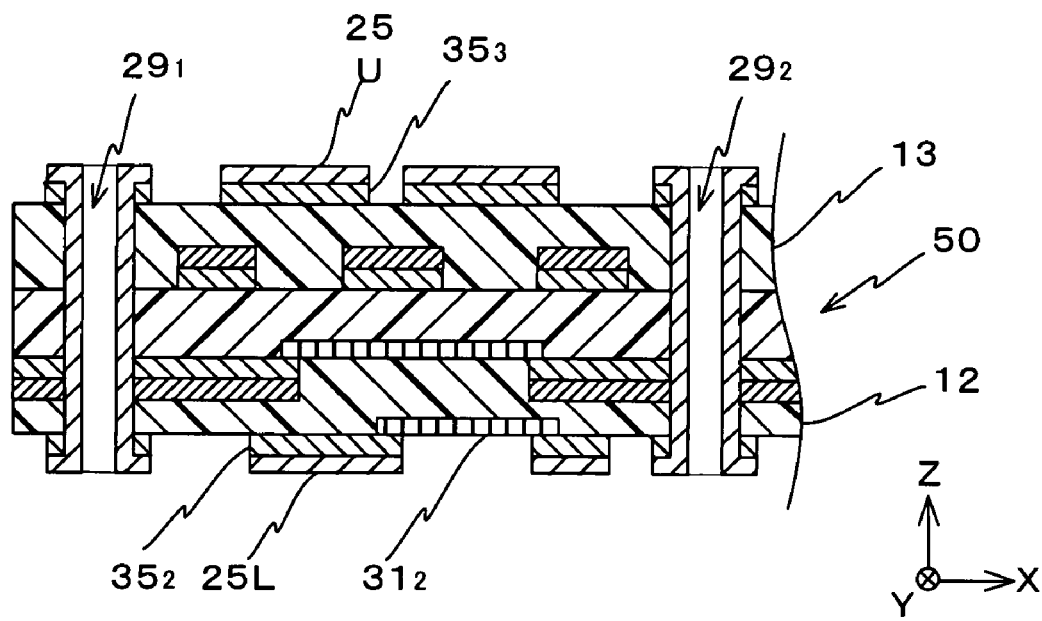
FIG. 12A is a view (No. 16) for explaining the production step of the printed wiring board shown in FIG. 1.
Figure 12B:
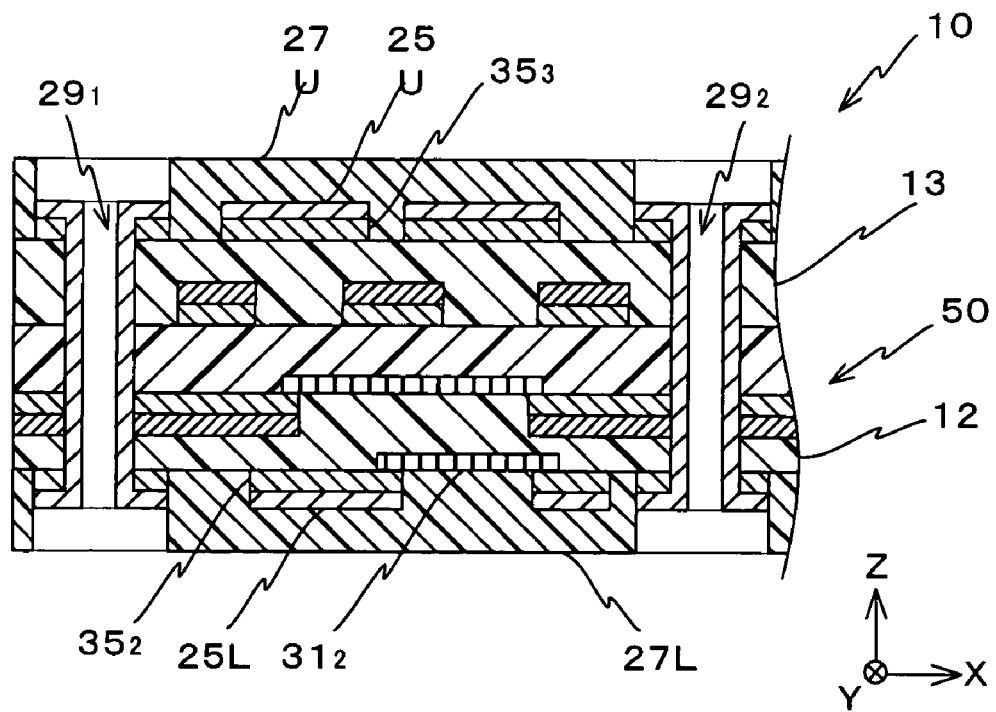
FIG. 12B is a view (No. 17) for explaining the production step of the printed wiring board shown in FIG. 1.

Then, the plating film 25A, the conductive films $33_2$ and $33_3$ in the exposed regions are removed by well-known etching to form the conductive patterns $35_3$ and 25U, the conductive patterns $35_2$ and 25, and via holes $29_1$ and $29_2$ (see FIG. 12A). Subsequently, the solder masks 27U and 27L are formed on the entire surfaces in the +Z and −Z directions, except for the terminals in the +Z and −Z directions, of both the via holes $29_1$ and $29_2$. In this manner, the printed wiring board 10 is produced.

After that, the printed wiring board containing the resistance elements of the present invention may be subjected to treatment such as nickel plating or solder plating, if necessary.

In this embodiment, as explained above, the resistance elements $31_1$ and $31_2$ have the surface roughness indicated by an arithmetic mean height (Ra) of 0.5 to 5 μm on the surface in the −Z direction, and also have the average thickness which is 5% to 50% of the arithmetic means height (Ra). Therefore, ensure the stable average thickness of the resistance elements $31_1$ and $31_2$ is ensured, maintaining the length of the current path in the resistance elements $31_1$ and $31_2$, to which both ends of them are connected to the conductive patterns.

Also, the resistance elements $31_1$ and $31_2$ are embedded close to the surfaces in the −Z direction of the insulating layers 11 and 12, and the conductive pattern wired surface is composed of the surfaces in the −Z direction of the both resistance elements $31_1$ and $31_2$ and the surfaces in the −Z direction of the insulating layers 11 and 12. Therefore, even when the conductive material layers are arranged on the conductive pattern wired surface to form the conductive pattern by photoetching or the like, the side surfaces of the resistance elements $31_1$ and $31_2$ are not corroded by the etching solution.

Furthermore, since the average thickness of the resistance elements $31_1$ and $31_2$ is 50% or less of the arithmetic mean height (Ra), which is the surface roughness in the −Z direction of the resistance elements $31_1$ and $31_2$, the surfaces in the +Z direction of the resistance elements $31_1$ and $31_2$, which connect to the insulating layers 11 and 12, also have inequality. Therefore, the resistance elements $31_1$ and $31_2$ and insulating layers 11 and 12 are connected with high adhesion.

According to the embodiment, the present invention provides to obtain the printed wiring board comprising resistance elements having accurate resistance values and is stable in a broad resistance value range.

Note that the number of resistance elements comprised in the printed wiring board is limited in the above explanation, but it is not particularly limited.

Figure 8A:
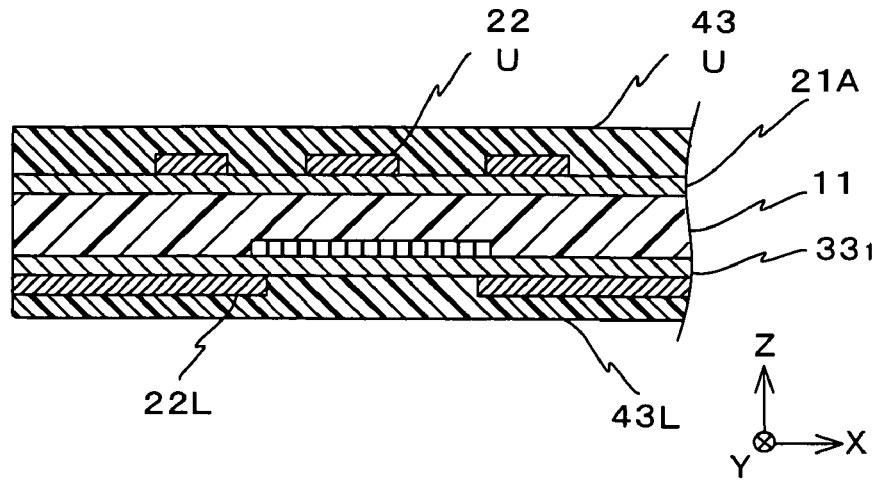
FIG. 8A is a view (No. 7) for explaining a Production step of the printed wiring board shown in FIG. 1.
Figure 8B:
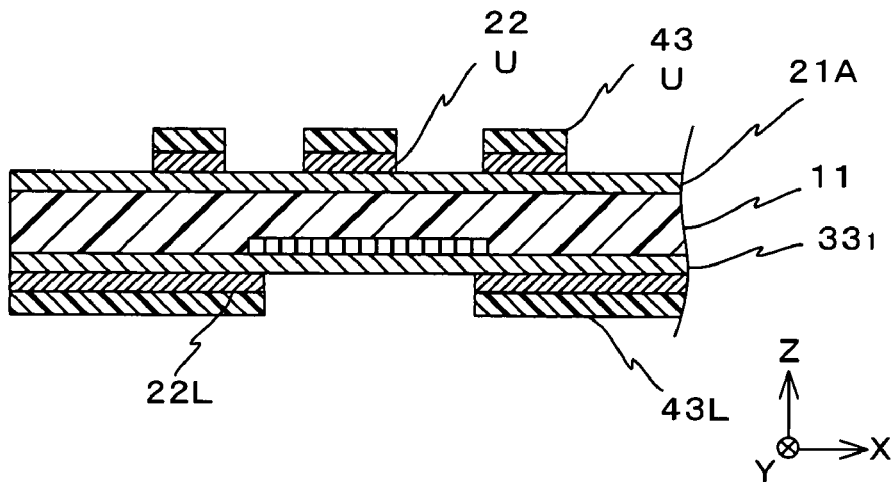
FIG. 8B is a view (No. 8) for explaining the production step of the printed wiring board shown in FIG. 1.
Figure 8C:
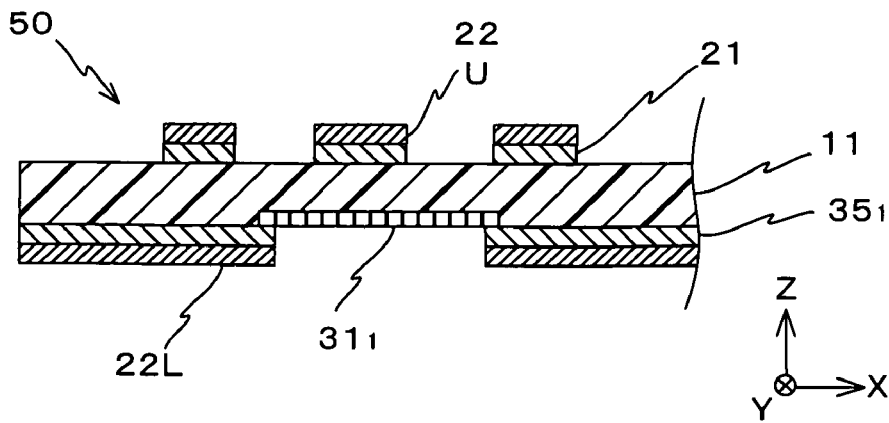
FIG. 8C is a view (No. 9) for explaining the production step of the printed wiring board shown in FIG. 1.

The surface in the −Z direction of the resistance element $31_j$ (j=1, 2) may be also coated with a protective film which is resistant against etching shown in FIG. 8C or that shown in FIG. 12A. This protective film is formed to have a thickness having substantially no effect on the resistance value of the resistance element $31_j$.

The printed wiring board containing the resistance element $31_j$ having this protective film is produced as follows.

Figure 13A:
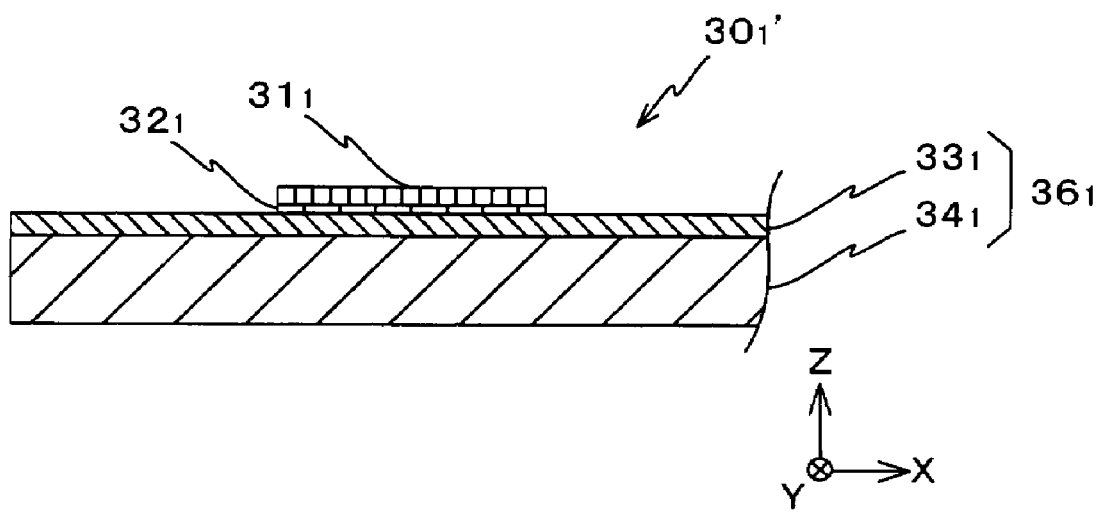
FIG. 13A is a view showing a schematic arrangement of the first resistance element module used in the production of a printed wiring board of a modified embodiment.
Figure 13B:
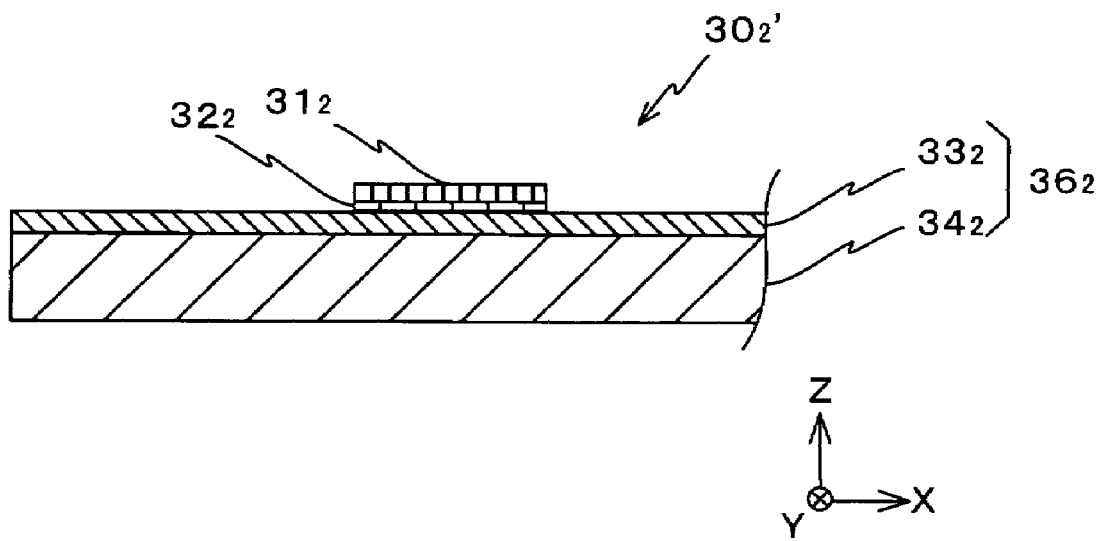
FIG. 13B is a view showing a schematic arrangement of the second resistance element module used in the production of the printed wiring board of the modified embodiment.

At first, the resistance element module $30_1'$ shown in FIG. 13A and the resistance element module $30_2'$ shown in FIG. 13B are produced. The resistance element module $30_j'$ is the same as the resistance element module $30_j$ (see FIGS. 3A and 3B) described earlier except that the protective film $32_j$ is formed between the conductive film $33_j$ and the resistance element $31_j$. As the material for the protective film $32_j$, chromium (Cr), iron (Fe), silver (Ag), gold (Au), vanadium (V), or the like can be used, when a copper film is used as the conductive film $33_j$. As the material for the protective film $32_j$, chromium (Cr), iron (Fe), gold (Au), vanadium (V), or the like can be used, when a silver film is used as the conductive film $33_j$.

Figure 14A:
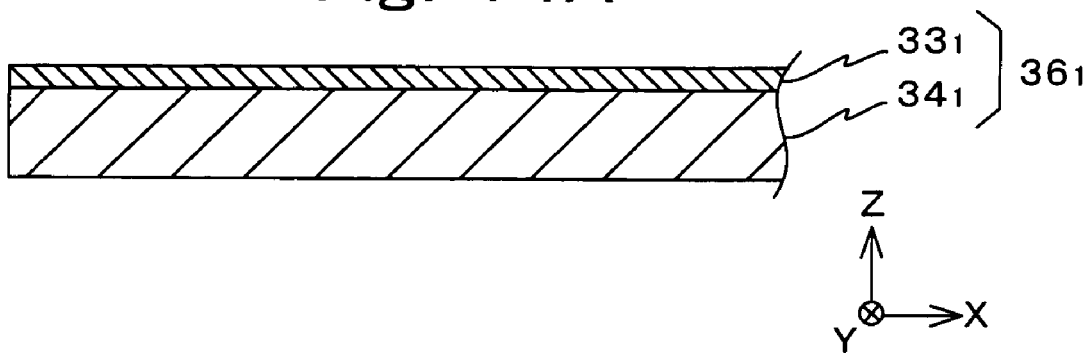
FIG. 14A is a view (No. 1) for explaining the production step of the resistance element module shown in FIG. 13A.
Figure 14B:
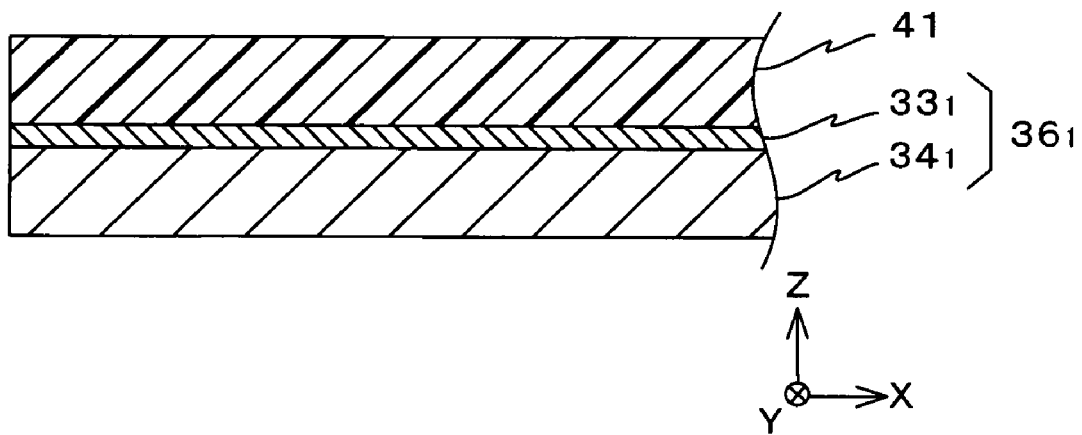
FIG. 14B is a view (No. 2) for explaining the production step of the resistance element module shown in FIG. 13A.
Figure 14C:
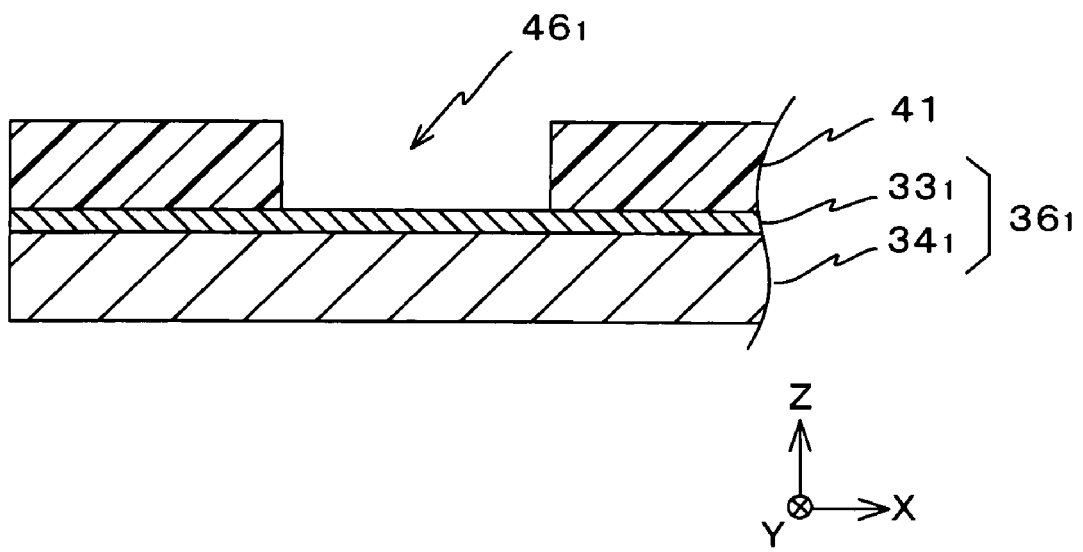
FIG. 14C is a view (No. 3) for explaining the production step of the resistance element module shown in FIG. 13A.

In the production of the resistance element module $30_1'$, similarly to the resistance element module $30_1$, the carrier with a conductive film $36_1$ is prepared (see FIG. 14A), the surface in the +Z direction of the conductive film $33_1$ is coated with the liquid photoresist to form the dry photoresist layer 41 (see FIG. 14B), and the recess $46_1$ is formed by removing the dry photoresist layer 41 on the prospective resistance element region, thereby exposing the surface in the +Z direction of the conductive film $33_1$ in the resistance element region for desired size (see FIG. 14C).

Figure 15A:
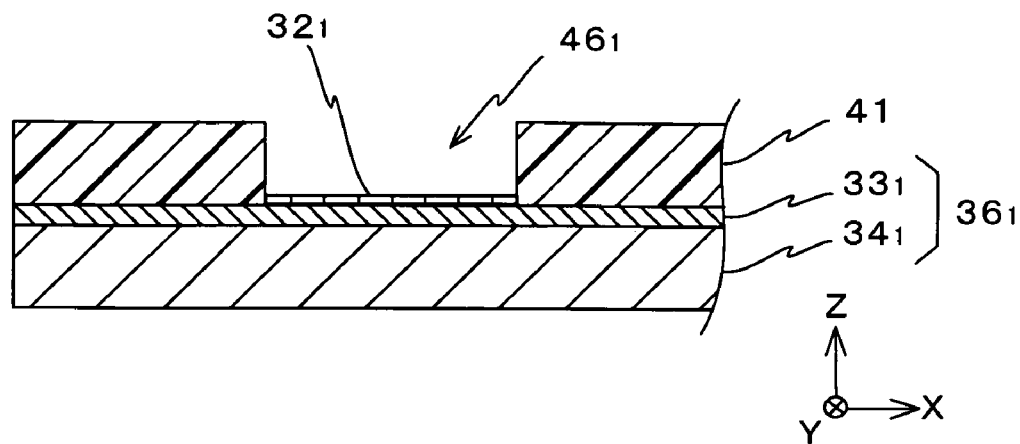
FIG. 15A is a view (No. 4) for explaining the production step of the resistance element module shown in FIG. 13A.

Then, the protective film $32_1$ on the surface in the +Z direction of the conductive film $33_1$ in the recess $46_1$ is formed by using plating, CVD, PVD, or the like (see FIG. 15A). In order to form the ultra thin protective film $32_1$, sputtering, one type of PVD, may be preferably used.

Figure 15B:
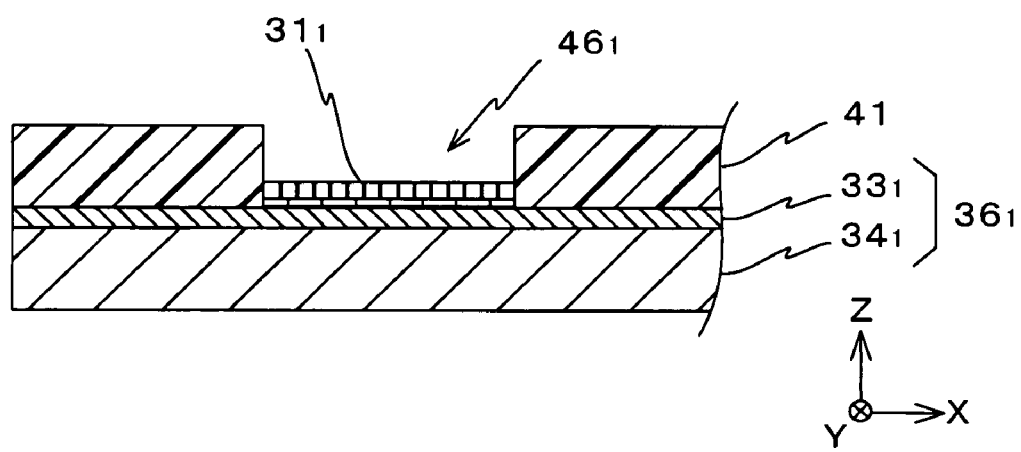
FIG. 15B is a view (No. 5) for explaining the production step of the resistance element module shown in FIG. 13A.
Figure 15C:
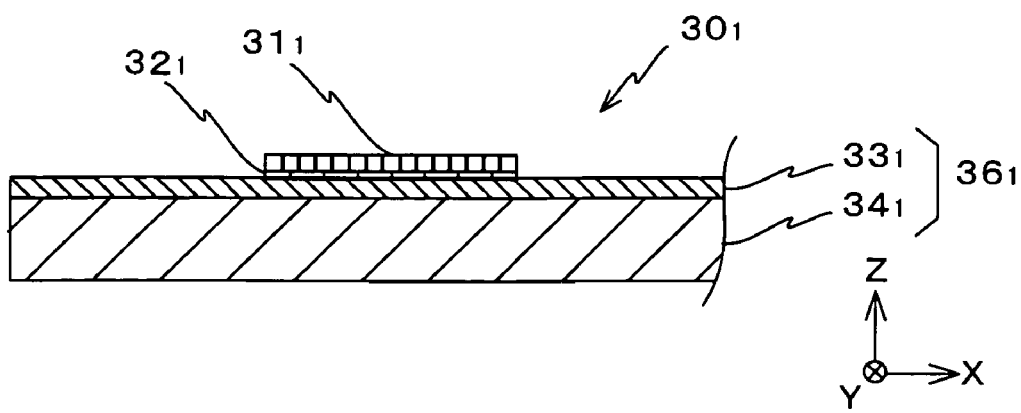
FIG. 15C is a view (No. 6) for explaining the production step of the resistance element module shown in FIG. 13A.

Then, similarly to the resistance element module $30_1$, the resistance element $31_1$ is formed on the surface in the +Z direction of the protective film $32_1$ by plating (see FIG. 15B). After that, the dry photoresist $41_1$ is removed from the surface in the +Z direction of the conductive film $33_1$ (see FIG. 15C). In this manner, the resistance element module $30_1'$ is produced.

The resistance element module $30_2'$ is also produced in the same manner as the resistance element module $30_1$.

EXAMPLES

Methods for producing the printed wiring board of the present invention and the properties of the produced printed wiring boards are described below in detail, by way of examples. Note that in these examples, the methods and the properties are explained, when nickel plating and other methods (see Tables 8 and 9) are used. However, the present invention is not limited to the following examples.

[1] Production of Resistance Elements for Example 1

(1-1) Production of Resistance Element for Example 1-1

As the support member, an ultra thin copper foil with the carrier having a roughened surface, Micro-Thin (Mitsui Mining & Smelting. Co., Ltd.) was used as the conductive film. This copper foil with the carrier has the 3.5-μm in thickness of the copper layer, and 1.2 μm of the arithmetic mean height (Ra) of the surface of the copper layer.

The dry film photoresist, HW440 (Hitachi Chemical Co., Ltd) was laminated on this copper layer, and photolithography was performed under the conditions such as light quantity of 110 mJ for 30 seconds by using $Na_2CO_3$ as a developer, thereby forming a mianda pattern having about 50 μm in width and about 100 mm in length, and then a hole having the size of approximately 1.2mm×4.5 mm was formed.

Then, the hypophosphite reducing bath (pH 4 to 5) having the composition shown in Table 3 in below was used to perform electroless nickel plating under the conditions at approximately 90° C. for 1 to 2 minutes. As a consequence, an electroless nickel film containing 10 wt % of phosphorus was formed. The average thickness of this film was 0.2 μm, and the ratio to Ra was 16.7%.

TABLE 3

| Electroless plating nickel-phosphorus bath composition | Content (g/L) |
|---|---|
| Nickel sulfate concentration | 21-26 |
| Sodium hypophosphite | 16-21 |
| Sodium acetate | approx. 25 |
| Sodium citrate | approx. 15 |
| Sulfuric acid | appropriate amount |

(1-2) Production of Resistance Element for Example 1-2

A printed wiring board containing a resistance element having a resistance value lower than that of the resistance element produced in (1-1) was produced as follows.

As the support member, the ultra thin copper foil with a carrier, Micro-Thin (Mitsui Mining & Smelting. Co., Ltd.) having a roughened surface was used. This copper foil with a carrier is composed of the 5-μm in thickness of the copper layer $33_2$ on 35-μm in thickness of the electrolytic copper foil carrier $34_2$ via an organic adhesive layer, and the arithmetic mean height (Ra) of the surface of this copper layer is 3.8 μm. FIG. 17 shows, as a sectional photograph, the surface of the ultra thin copper foil with the carrier shown in FIG. 16. Copper grains having the diameter of 1 to 2 μm overlap each other on this surface to form large inequalities. This surface will be referred to as a "conductor surface" hereinafter.

One surface of the ultra thin copper foil with the carrier was coated with the liquid photoresist, PER-20 (TAIYO INK MFG. CO., LTD.) to form a photoresist on a resistance element region. Subsequently, the photoresist was removed by photoetching to expose, through the hole, the conductor surface by 100 μm in width and 900 μm in length.

Then, the nickel sulfate bath (pH 4 to 5) having the composition shown in Table 4 in below was used to perform nickel plating under the conditions such as from 40° C. to 60° C., a current density of approximately 2 to 6 A/dm$^2$, for about 1 minute, thereby forming the resistance element. The average thickness of the nickel plating formed was 0.40 μm, and the ratio to Ra was 10.5%.

TABLE 4

| Nickel sulfate bath composition | Content of each component (g/L) |
| --- | --- |
| Nickel sulfate | approx. 300 |
| Nickel chloride | approx. 50 |
| Boric acid | approx. 40 |

After that, the photoresist was stripped by a resist stripping agent to produce the resistance element module $30_2$.

(1-3) Production of Resistance Element for Example 1-3

The resistance element for Example 2 was formed following the same procedures as in (1-2) described above except that the chromium sulfate bath (pH 2.0 to 2.7) having the composition shown in Table 5 in below was used to perform chromium plating under the conditions such as at 30° C. to 55° C., a current density of approximately 18 to 48 A/dm$^2$, for about 1 minute. The average thickness of the chromium plating formed was 1.6 μm, and the ratio to Ra was 42%.

TABLE 5

| Chromium bath composition | Content of each component (g/L) |
| --- | --- |
| Chromium sulfate | 180-220 |
| Urea | 210-264 |
| Ammonium sulfate | 396-saturation conc. |

(1-4) Production of Resistance Element for Example 1-4

As the support member, the ultra thin copper foil with a carrier, Micro-Thin (Mitsui Mining & Smelting. Co., Ltd.) having the roughened surface was used. This copper foil with the carrier is composed of 5 μm in thickness of the copper layer $33_2$ on 35-μm in thickness of the electrolytic copper foil carrier $34_2$ via the organic adhesive layer, and the arithmetic mean height (Ra) of the surface of this copper layer is 3.8 μm.

The dry film photoresist, HW440 (Hitachi Chemical Co., Ltd) was laminated on this copper layer, and photolithography was performed under the conditions that development was performed under the conditions at a light quantity of 110 mJ for 30 seconds by using $Na_2CO_3$ as the developer, thereby forming the mianda pattern having about 50 μm in width and about 100 mm in length, formed the hole having the size of approximately 1.2 mm×4.5 mm.

Then, the hypophosphorous acid reducing bath (pH 4 to 5) having the composition shown in above-mentioned Table 3 was used to perform electroless nickel plating at approximately 90° C. for 1 to 2 minutes. As a consequence, an electroless nickel film containing 10 wt % of phosphorus was formed. The average thickness of this film was 0.19 μm, and the ratio to Ra was 5.0%.

(1-5) Production of Resistance Element for Example 1-5

The resistance element for Example 1-5 was produced according to the same procedures as in (1-1) described above except that electroless nickel plating was performed under the condition at approximately 90° C. for 5 minutes, thereby forming an electroless nickel film containing 10 wt % of phosphorus. The average thickness of this film was 0.6 μm, and the ratio to Ra was 50.0%.

[2] Production of Resistance Elements for Examples 2-1 to 2-5

Electroless nickel films containing 5 to 15 wt % of phosphorus were formed according to the same procedures as in (1-1) described above except that electroless nickel plating was performed under the conditions at approximately 90° C. for 1 to 5 minutes by using a hypophosphorous acid reducing bath (pH 4 to 5) having the composition shown in the above-mentioned Table 3.

The average plating thickness and the ratios to Ra of the resistance elements for Examples 2-1 to 2-5 were 8.3% to 16.7% as shown in Table 10 to be presented later.

3Production of Resistance Elements for Examples 3-1 to 3-12

Resistance elements for Examples 3-1 to 3-12 were produced according to the same procedures as in (2) described above except that electroless plating was performed by using various metals shown in Table 11 instead of nickel. The composition of the plating bath was as shown in Table 6 in below, and plating was performed in this plating bath under the conditions at a pH from 3 to 5 and the plating temperature of 50° C. to 90° C. for 1 to 2 minutes.

Note that the metal compounds shown in Table 11 used in the metal bath described below were appropriately selected from the group consisting of the sulfate compound group consisting of cobalt sulfate, indium sulfate, indium (II) sulfate, lithium sulfate, titanium sulfate, chromium sulfate, tin sulfate, iron sulfate, vanadium sulfate, and zirconium sulfate; chloride compound group consisting of iron chloride, platinum chloride, and chromium chloride; and oxides such as tantalum oxide.

TABLE 6

| Metal bath composition | Content of each component |
| --- | --- |
| Metal compounds shown in Table 11 | 10-30 g/L |
| Sodium hypophosphite | 10-20 g/L |

[4] Production of Resistance Elements for Comparative Examples (4-1) Production of Resistance Elements for Comparative Example 1

As a support member, the ultra thin copper foil with a carrier, the ultra thin copper foil with the carrier (Olin Brass Corporation)having the arithmetic mean height of 7 μm, or the ultra thin copper foil with the carrier, Micro-Thin (Mitsui Mining & Smelting. Co., Ltd.) having the arithmetic mean height of 3.8 μm was used.

Then, the nickel sulfate bath (pH 4 to 5) having the composition shown in Table 4 was used to perform nickel plating under the condition such as at a temperature from 40° C. to 60° C., a current density of approximately 2 to 6 A/dm$^2$, for about 1 minutes, thereby producing resistance elements for Comparative Example 1.

Table 8 shows the average thickness and the ratio to Ra of the nickel plating of the produced resistance elements for Comparative Example 1. In the resistance elements for Comparative Example 1, the average plating thickness was 2.8 μm, and the ratio of the average plating thickness to Ra was 73.7%.

(4-2) Production of Resistance Elements for Comparative Example 2

The same ultra thin copper foil with the carrier, Micro-Thin (Mitsui Mining & Smelting. Co., Ltd.) having the same roughened surface as used in the Production of the resistance element for Example 1-1 was used.

The ultra thin copper foil with a carrier was processed according to the same procedures as in the production of the resistance element for Example 1-1, except that the hypophosphorous acid reducing bath (pH 4 to 5) having the composition shown in the above-mentioned Table 3 was used to perform electroless nickel plating under the condition at approximately 90° C. for 1 to 5 minutes. In this manner, electroless nickel films containing from 3 to 17 wt % of phosphorus were formed. Table 10 shows the average thickness and the ratio to Ra of these films. In the resistance elements for Comparative Example 2, the average plating thickness was 0.03 μm, and the ratio of the average plating thickness to Ra was 2.5%.

[5] Production of Resistance Elements for Reference Examples

(5-1) Production of Resistance Elements for Reference Example 1

As the support member, the ultra thin copper foil with a carrier, the ultra thin copper foil with a carrier (Olin Brass Corporation) having the arithmetic mean height of 7 μm, or the ultra thin copper foil with a carrier, Micro-Thin (Mitsui Mining & Smelting. Co., Ltd.) having the arithmetic mean height of 3.8 μm was used.

Then, the nickel sulfate bath (pH 4 to 5) having the composition shown in Table 4 was used to perform nickel plating under the conditions at 40° C. to 60° C. and a current density of approximately 2 to 6 A/dm$^2$ for about 1 minute, thereby producing resistance elements for Reference Example 1

Table 9 shows the average thickness and the ratio to Ra of the nickel plating of the produced resistance elements for Reference Example 1. In the resistance elements for Reference Example 1, the average plating thickness was 2.3 μm, and the ratio of the average plating thickness to Ra was 32.9%.

(5-2) Production of Resistance Elements for Reference Examples 2 and 3

As the support members for these two Reference Examples 2 and 3, the ultra thin copper foil with the carrier, Micro-Thin (Mitsui Mining & Smelting. Co., Ltd.) having a roughened surface, which is the same one as used in the production of the resistance element for Example 1-1, was used.

Resistance elements for Reference Examples 2 and 3 were produced according to the same procedures as in Example 1-1, except that the hypophosphorous acid reducing bath (pH 4 to 5) having the composition shown in the above-mentioned Table 3 was used to perform electroless nickel plating on the ultra thin copper foil under the conditions at approximately 90° C. for 1 to 5 minutes. In this manner, electroless nickel films containing 3 to 17 wt % of phosphorus were formed. Table 10 shows the average thickness and the ratio to Ra of the formed films. In the resistance elements for Reference Examples 2 and 3, the average plating thickness was 0.2 μm, and the ratio of the average plating thickness to Ra was 16.7%.

[6] Production of Printed Wiring Boards of Examples 1-1 to 3-12, Comparative Examples 1 and 2, and Reference Examples 1 to 3, as well as Measurements of Average Resistance Values Thereof

(6-1) Production of Printed Wiring Boards of Examples 1-1 to 3-12, Comparative Examples 1 and 2, and Reference Examples 1 to 3

Although the respective resistance element were produced as described above, 100or 200 resistance elements were formed on each support member to obtain modules $30_2$ for producing the printed wiring board for Examples 1-1 to 3-12, Comparative Examples 1 and 2, and Reference Examples 1 to 3.

In order to form the insulating layer 11 on this base material, the prepreg having 60-μm in thickness, GEA-67N (Hitachi Chemical Co., Ltd) and either of the resistance elements $31_1$ or $31_2$ were placed to face each other. Then, the copper foil 21A, 3EC-III 12 μm in thickness (Mitsui Mining & Smelting. Co., Ltd.) was placed on another surface of the resistance element, on which the prepreg was not placed, and pressed at 185° C. and 40 kg/cm$^2$ for 1 hour to from a pressed article. After the prepreg cured, the carrier member $34_1$ was mechanically removed.

Subsequently, the carrier member $34_1$ was similarly removed, and the acrylic-resin-based dry film photoresist, HW440 (Hitachi Chemical Co., Ltd) was laminated on the both surfaces of the article by using a laminator. After that, photolithography was performed to form recesses 47U as shown in FIG. 7A.

Then, the plating bath having the composition shown in Table 7 in below was used to perform copper plating in the copper sulfate plating bath to form 15-μm in thickness plating layers as conductive patterns 22U and 22L.

TABLE 7

| Copper plating bath composition | Content of each component (g/L) |
|---|---|
| Copper sulfate | 125-250 |
| Sulfuric acid | 30-100 |

Dry film photoresist 42U and 42L were removed by photolithography. Then, as shown in FIG. 8A, the photoresist layer 43U was formed on the surface in the +Z direction of the copper foil 21A and the photoresist layer 43U was formed in the −Z direction of the copper foil $33_1$, by using the laminator, roll coater, or the like. After that, the photoresist layers were removed by photolithography from the regions which are not covered with the plating films, conductive patterns 22U and 22L, and the copper foil $33_1$ was etched until the resistance element $31_1$ was appeared.

As described above, the conductive patterns 22U and 22L shown in FIG. 8C were formed.

The above processing was performed for each base material to produce 30 printed wiring boards for each of Examples 1-1 to 1-5, Comparative Examples 1 and 2, and Reference Examples 1 to 3.

Before insulating layers 41 and 43 were formed, each resistance element formed as described above was subjected to the black oxide treatment by using a 10% NaOH solution at 50° C. for improving the adhesion between the insulating layers, a circuit 61, and the electrode 22a.

(6-2) Production of Multilayered Printed Wiring Boards

Figure 9A:
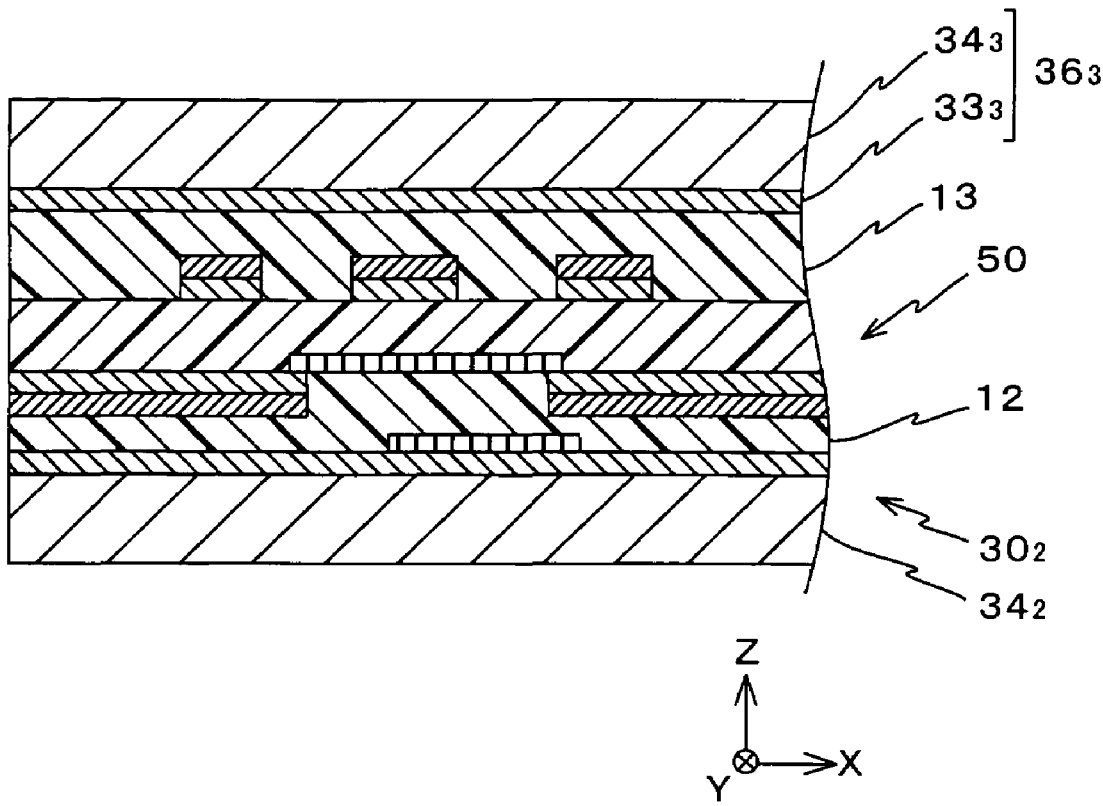
FIG. 9A is a view (No. 10) for explaining the production step of the printed wiring board shown in FIG. 1.

The base material produced as described above, the prepreg 13, GEA-67N (Hitachi Chemical Co., Ltd), the copper foil with a carrier $36_3$, 3EC-III 12 μm in thickness (Mitsui Mining & Smelting. Co., Ltd.), and $30_2$ produced as above were laminated as shown in FIG. 9A, and then pressed at 185° C. and 40 kg/cm² for 1 hour, thereby forming insulating layers 12 and 13.

Figure 9B:
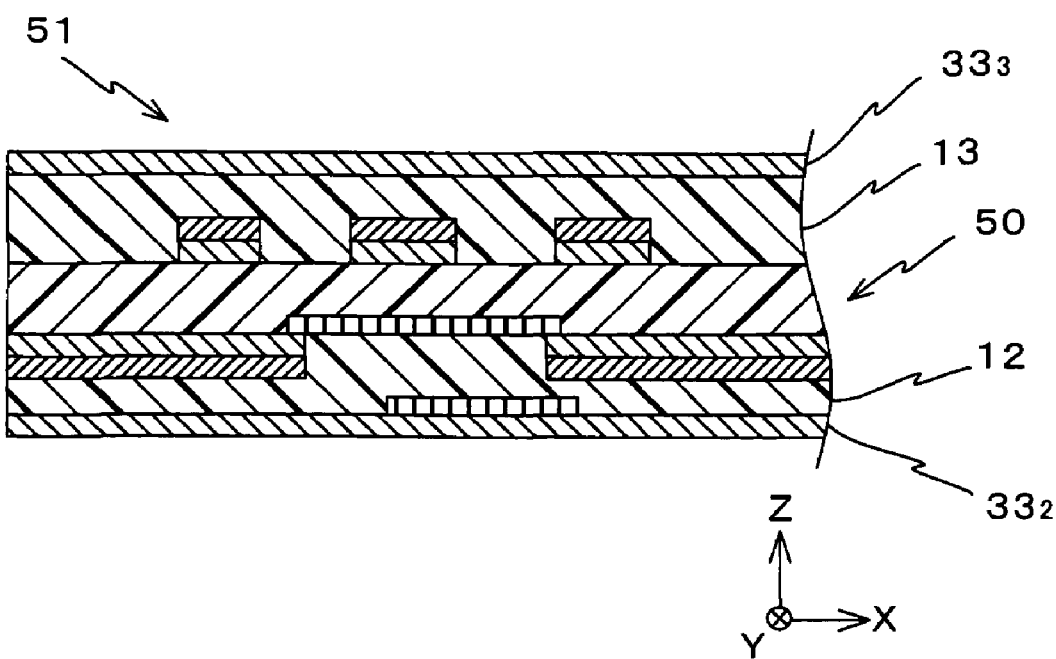
FIG. 9B is a view (No. 11) for explaining the production step of the printed wiring board shown in FIG. 1.

Then, carriers $34_2$ and $34_3$ were removed to form the laminates 51 as shown in FIG. 9B. As shown in FIG. 10A, through holes are formed in predetermined positions by using a drill, and 15-μm in thickness of copper plating film was formed on the entire surface of the laminates including its surfaces, on which these through holes were not formed, under the plating conditions shown in Table 8 in below (see FIG. 10B).

TABLE 8

| Copper plating bath composition | Content of each component (g/L) |
|---|---|
| Copper sulfate | 125-250 |
| Sulfuric acid | 30-100 |

Figure 11A:
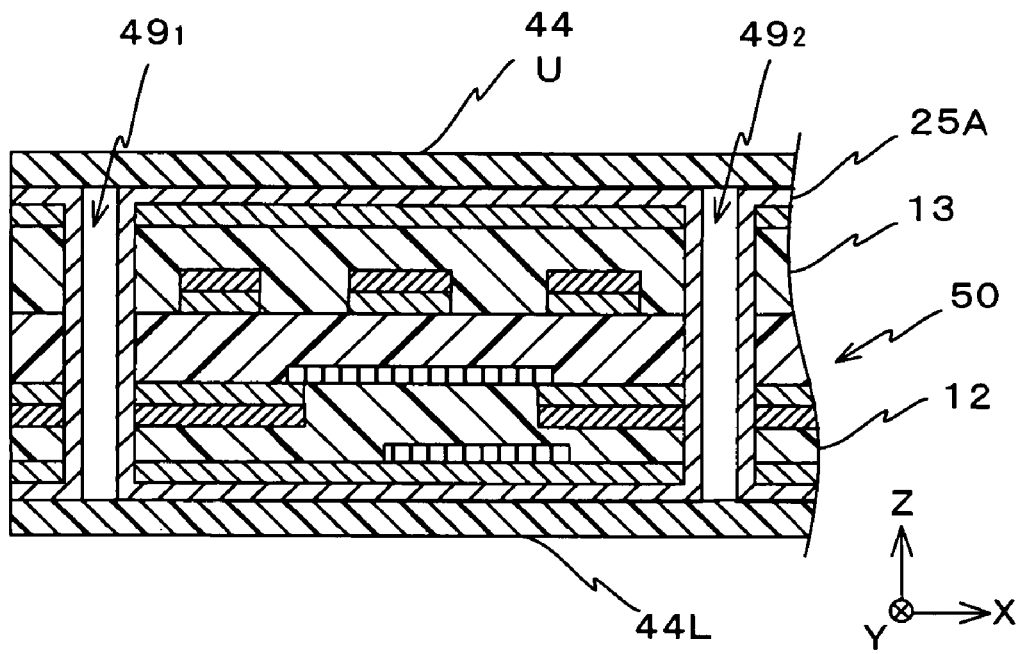
FIG. 11A is a view (No. 14) for explaining the production step of the printed wiring board shown in FIG. 1.
Figure 11B:
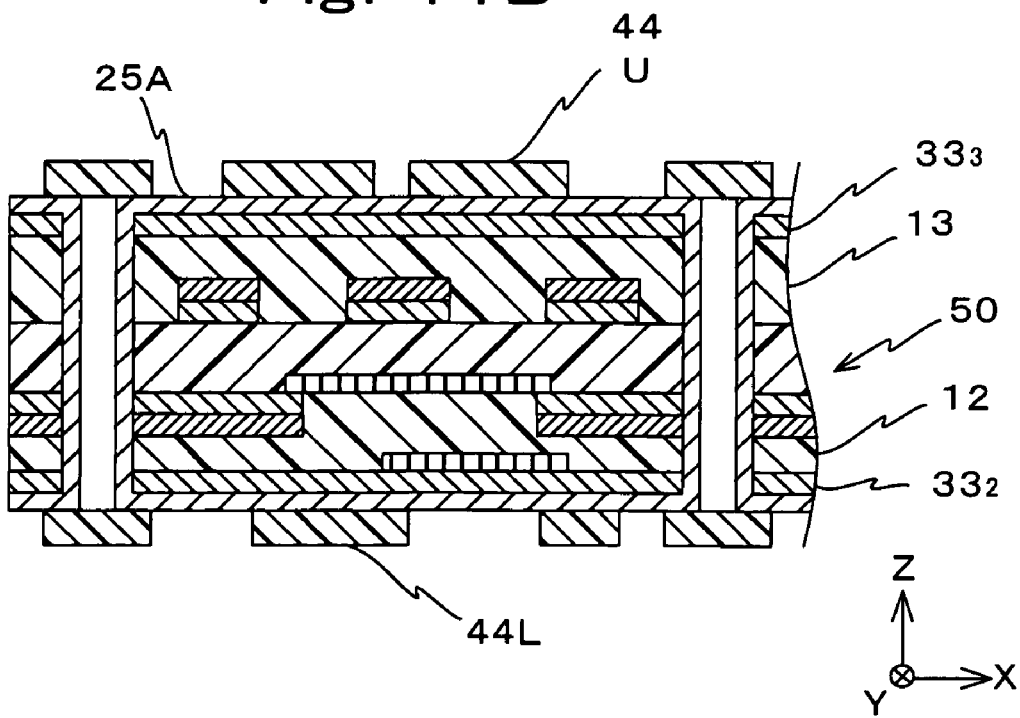
FIG. 11B is a view (No. 15) for explaining the production step of the printed wiring board shown in FIG. 1.

Subsequently, as shown in FIG. 11A, the both surfaces of the copper-plated laminates were coated with the acrylic-resin-based dry film photoresist, HW440 (Hitachi Chemical Co., Ltd) by using the laminator, thereby forming photoresist layers 44. The opening 25A as shown in FIG. 11B were formed by photolithography, showering $Na_2CO_3$ for 30 seconds, and etching was performed by using an alkali etchant to form electrodes composed of 25U and $35_3$, as well as 25L and $35_2$.

Then, the two surfaces were coated with AUS503 available from TAIYO INK MFG. CO., LTD. by screen printing to form solder mask layers 27U and 27L except for the openings of the through holes, thereby producing multilayered printed wiring boards 10 of Examples 1-1 to 3-12, Comparative Examples 1 and 2, and Reference Examples 1 to 3.

(6-3) Measurements of, e.g., Resistance Values and Differences under Various Conditions

(6-3-1) Measurements of Resistance Values of Resistance Elements

A resistance measurement apparatus, 3244 Hi TESTER (HIOKI E. E. CORPORATION) was used to measure the actual resistance values of the resistance elements of Examples 1-1 to 2-5, Comparative Examples 1 and 2, and Reference Examples 1 to 3 at 200° C. Tables 9 and 10 show the measurement results (resistance value 1).

TABLE 9

|  | Example 1 | | | | | Reference example | Comparative example | |
|---|---|---|---|---|---|---|---|---|
|  | 1-1 | 1-2 | 1-3 | 1-4 | 1-5 | 1 | 1 | 2 |
| Resistance surface Ra (μm) | 1.2 | 3.8 | 3.8 | 3.8 | 1.2 | 7 | 3.8 | 1.2 |
| Average plating thickness (μm) | 0.2 | 0.4 | 1.6 | 0.19 | 0.6 | 2.3 | 2.8 | 0.03 |
| Average plating thickness/Ra (%) | 16.7 | 10.5 | 42 | 5.0 | 50 | 32.9 | 73.7 | 2.5 |
| Element used | $31_1$ | $31_2$ | $31_1$ | $31_1$ | $31_1$ | $31_1$ | $31_2$ | $31_1$ |
| Resistance material formation method | Electroless plating of Ni | Electroplating of Ni | Chromium plating | Electroless plating of Ni | Electroless plating of Ni | Electroplating of Ni | Electroplating of Ni | Electroless plating of Ni |
| Phosphorus content (W/W %) | 10 | 0 | 0 | 10 | 10 | 0 | 0 | 10 |
| Number of resistances | 200 | 100 | 100 | 200 | 200 | 100 | 100 | 200 |
| Resistance value 1*¹ ± SD (Ω) | 19.6k ± 0.58k | 25.4 ± 0.51 | 11.8 ± 0.38 | 39.4 ± 0.29 | 51.4 ± 0.32 | 62.4 ± 0.53 | 3.6 ± 0.30 | 125k ± 5.1k |
| (%) | 2.76 | 2.0 | 3.2 | 3.0 | 2.7 | 4.92 | 8.33 | 4.8 |
| Difference*² (%) | 2.00 | 1.50 | 2.5 | 2.90 | 2.40 | 4.90 | 12.50 | 8.4 |
| Resistance value 3*³ | 19.9k | 25.8 | 12 | 40.1 | 52.4 | 65.4 | 3.7k | >1M |
| Resistance change rate (%) | 1.53 | 1.57 | 1.7 | 1.77 | 1.91 | 4.81 | 4.5 | —*⁵ |
| Resistance change coefficient (ppm/° C.) | 64 | 65 | 70.6 | 72.1 | 69.1 | 90.1 | 188 | — |
| Oil-dip test*⁴ | 900/2.6 | 900/1.6 | 900/0.5 | 900/3.9 | 900/3.7 | 900/5.1 | 900/30.2 | 900/75 |

*¹The average resistance value after treatment was performed in 10% NaOH at 50° C.
*²The difference of the measurement value of the printed wiring board from the actually measured resistance value (target value) of each resistance element
*³The resistance value (Ω) at 260° C.
*⁴The number of cycles/the resistance change rate(%)
*⁵Immeasurable

TABLE 10

|  | Example 2 | | | | | Reference example | |
| --- | --- | --- | --- | --- | --- | --- | --- |
|  | 2-1 | 2-2 | 2-3 | 2-4 | 2-5 | 2 | 3 |
| Resistance surface Ra (μm) | 1.2 | 1.2 | 1.2 | 1.2 | 1.2 | 1.2 | 1.2 |
| Average plating thickness (μm) | 0.1 | 0.2 | 0.2 | 0.2 | 0.1 | 0.2 | 0.2 |
| Average plating thickness/Ra (%) | 8.3 | 16.7 | 16.7 | 16.7 | 8.3 | 16.7 | 16.7 |
| Element used | $31_1$ | $31_1$ | $31_1$ | $31_1$ | $31_1$ | $31_1$ | $31_1$ |
| Resistance material formation method | | | Electroless plating of Ni | | | Electroless plating of Ni | |
| Phosphorus content (W/W %) | 10 | 6 | 14 | 5 | 15 | 3 | 17 |
| Number of resistances | 200 | 200 | 200 | 200 | 200 | 200 | 200 |
| Resistance value 1[*1] ± SD (Ω) (%) | 36.1 ± 1.1 | 16.7 ± 0.42 | 25.6 ± 0.46 | 10.9 ± 0.31 | 29.3 ± 0.39 | 14.4 ± 0.53 | 38.6 ± 0.86 |
|  | 3.05 | 2.51 | 1.80 | 2.85 | 2.79 | 3.68 | 2.23 |
| Difference[*2] (%) | 1.25 | 1.00 | 2.1 | 2.3 | 2.4 | 4.5 | 4.8 |
| Resistance value 3[*3] | 36.7 | 17.1 | 26.2 | 46.4 | 30.1 | 15.1 | 40.5 |
| Resistance change rate (%) | 1.66 | 2.40 | 2.34 | 2.65 | 2.70 | 4.86 | 4.92 |
| Resistance change coefficient (ppm/°C.) | 68.2 | 70.2 | 73.6 | 71.2 | 72.9 | 93.3 | 102 |
| Oil-dip test[*4] | 900/2.3 | 900/2.9 | 900/3.2 | 900/3.8 | 900/3.6 | 900/9.5 | 900/11.3 |

[*1] The average resistance value after treatment was performed in 10% NaOH at 50° C.
[*2] The difference of the measurement value of the printed wiring board from the actually measured resistance value (target value) of each resistance element
[*3] The resistance value (Ω) at 260° C.
[*4] The number of cycles/the resistance change rate (%)

The standard deviations of the resistance value for Examples 1-1 to 1-5 were from 2.0% to 3.2%. In contrast, the standard deviation of the resistance value for Reference Example 1 was as high as 4.92%, and the resistance value standard deviations of Comparative Examples 1 and 2 were as high as 8.33% and 4.8%, respectively. (6-3-2) Measurements of Deviations of Resistance Values in Printed Wiring Boards The resistance values of the multilayered printed wiring boards produced as described above were measured by using the resistance measurement apparatus, 3244 Hi TESTER (by HIOKI E. E. CORPORATION). Assuming that the resistance value of each resistance element measured in (6-1) described above was a target value, the deviation of each measurement result from this target value was obtained, and is shown as a deviation (%) in Tables 9 to 11.

If the deviation of the resistance value described above is 5% or less, it is judged good. The deviations of the resistance elements of Examples 1-1 to 3-12 and the resistance elements of Reference Examples 1 to 3 were 5% or less, and therefore their results were judged good. Among these resistance elements, since the deviation values of the resistance elements of Examples 1-1 to 3-12 were as low as 3% or less, these values were judged very good. In contrast, since the deviations of the resistance elements of Comparative Examples 1 and 2 exceeded 5%, these differences were not judged good.

(6-3-3) Measurements of Resistance Values at High Temperatures

The resistance measurement apparatus, 3244 Hi TESTER (HIOKI E. E. CORPORATION) was used to measure at 260°

TABLE 11

|  | Example 3 | | | | | | | | | | | |
| --- | --- | --- | --- | --- | --- | --- | --- | --- | --- | --- | --- | --- |
|  | 3-1 | 3-2 | 3-3 | 3-4 | 3-5 | 3-6 | 3-7 | 3-8 | 3-9 | 3-10 | 3-11 | 3-12 |
| Metal[*1] | Co | In | Li | Ti | Cr | Sn | Ta | Pt | Fe | Pd | V | Zr |
| Resistance surface Ra (μm) | 1.2 | 1.2 | 1.2 | 1.2 | 1.2 | 1.2 | 1.2 | 1.2 | 1.2 | 1.2 | 1.2 | 1.2 |
| Average plating thickness (μm) | 0.1 | 0.1 | 0.1 | 0.1 | 0.1 | 0.1 | 0.1 | 0.1 | 0.1 | 0.1 | 0.1 | 0.1 |
| T[*2]/Ra (%) | 8.63 | 8.3 | 8.3 | 8.3 | 8.3 | 8.3 | 8.3 | 8.3 | 8.3 | 8.3 | 8.3 | 8.3 |
| Element used | $31_1$ | $31_1$ | $31_1$ | $31_1$ | $31_1$ | $31_1$ | $31_1$ | $31_1$ | $31_1$ | $31_1$ | $31_1$ | $31_1$ |
| Resistance material formation method | | | | | | Electroless plating | | | | | | |
| Number of resistances | 200 | 200 | 200 | 200 | 200 | 200 | 200 | 200 | 200 | 200 | 200 | 200 |
| Resistance value 1[*3] (Ω) | 24.4k | 53.9k | 35.4k | 72.4 | 67.8 | 28.9k | 72.4 | 32.7 | 98.3 | 44.5k | 102.3 | 78.4k |
| Difference[*4] | 1.72 | 1.61 | 1.80 | 2.00 | 1.90 | 1.70 | 1.89 | 2.00 | 1.70 | 1.90 | 1.74 | 1.80 |
| Resistance value 3[*5] (Ω) | 24.9k | 55.0k | 36.0k | 73.8 | 69.1 | 29.5k | 73.8 | 33.4 | 100.3 | 45.5k | 104.3 | 80.1k |
| Resistance change rate (%) | 2.05 | 2.04 | 1.70 | 1.93 | 1.91 | 2.07 | 1.93 | 2.14 | 2.03 | 2.25 | 1.96 | 2.17 |
| Oil-dip test[*6] | 900/2.9 | 900/2.8 | 900/3.2 | 900/3.0 | 900/2.7 | 900/3.1 | 900/2.3 | 900/2.9 | 900/3.3 | 900/2.8 | 900/3.9 | 900/3.6 |

[*1] The metal used in plating
[*2] The average plating thickness (μm)
[*3] The average resistance value after processing was performed in 10% NaOH at 50° C.
[*4] The difference of the measurement value of the printed wiring board from the actually measured resistance value (target value) of each resistance element
[*5] The resistance value (Ω) at 260° C.

C. the resistance value (the resistance value 3) of each of the resistance elements of the examples, comparative examples, and reference examples described above.

From each resistance value, the resistance change rate (%) is calculated basis on the resistance value 1, and the results are shown in Tables 9, 10, and 11 as the measurement results (the resistance value 3, the resistance change rate) of Examples 1-1 to 3-12, Comparative Examples 1 and 2, and Reference Examples 1 to 3. The resistance change coefficient was measured for each of the resistance elements of Examples 1-1 to 2-5.

A resistance change rate of 5% or less is judged good. Since the resistance change rates when the resistance elements of Examples 1-1 to 3-12 and Reference Examples 1 to 3 used in the printed wiring boards were as lows as 5% or less, these results were judged good. Among these resistance elements, since the values of the resistance elements of Examples 1-1 to 3-12 were as very low as 3% or less, these results were judged very good. In contrast, the values of the resistance elements of Comparative Example 2 were immeasurable. Although the values of the resistance elements of Comparative Example 1 were 5% or less, however, their results were not judged good; because variations in resistance value 1 described above were large, and the resistance change rates in the oil-dip test described below were high.

Accordingly, the resistance elements of Examples 1-1 to 3-12 had highly stabile resistance values.

Note that the resistance change coefficients (ppm/° C.) were the lowest increased in the examples, and it was increased in order of the examples, the reference examples, and the comparative examples.

(6-3-4) Connecting Structure Stability Test

The laminates of Examples 1-1 to 3-12, Comparative Examples 1 and 2, and Reference Examples 1 to 3 were used as samples to conduct on oil-dip test, thereby testing the stability of the connecting structure. In the oil-dip test, the sample was dipped in oil at 260° C. for 20 seconds per cycle, and the resistance value after 900 cycles were repeated was measured. The resistance value change rate of the measurement value basis on the resistance value 1 was calculated, and is shown in Tables 9 to 11.

The resistance change rate in the laminates oil-dip test is judged good if it is 12% or less. As shown in Tables 9 and 10, the resistance change rate was judged good when any of the resistance elements of Examples 1-1 to 2-5 and Reference Example 1 to 3 was used.

Especially when the resistance elements of Examples 1-1 to 1-5 and the resistance elements of Examples 2-1 to 2-5 were used, the resistance change rates were 5% or less and judged very good.

In contrast, when the resistance elements of Comparative Examples 1 and 2 were used, the resistance change rates were as very high as 30% or more, and were not judged good.

Accordingly, in each of the laminates using the resistance elements of Examples 1-1 to 1-5, the stability of the connecting structure was high.

The phosphorus contents in Examples 2-1 to 2-5 were 5 to 15 wt %, and the phosphorus contents in the laminates of Reference Examples 2 and 3 were respectively 3 and 17 wt %.

From the resistance change rates after the oil-dip test described above, it is demonstrated that the laminate having fewer errors and a high structural stability may be produced when the phosphorus content is within the range between 5 and 5 wt %.

Also, even when the resistance elements plated by using the metals shown in Table 11 were used, the resistance change rates (%) were 5% or less, maintaining 5% or less of the resistance change rates after the oil-dip test. This indicates that highly stable laminates were produced.

As explained in above, the printed wiring board of the present invention may provide that comprising resistance elements having stable and accurate resistance values. Accordingly, the printed wiring board of the present invention is useful as that used in electronic apparatuses such as communication apparatuses.

What is claimed is:

1. A printed wiring board comprising:
   an insulating layer;
   a conductor pattern arranged adjacent to the insulating layer; and
   at least one resistance element comprising a metal and having a main portion provided on said insulating layer and at least one lead portion provided on said conductor pattern, the resistance element having a roughened surface contour with an arithmetic mean height and an average thickness of from 5% to 50% of the arithmetic mean height of the roughened surface contour, wherein said arithmetic mean height of said roughened surface is from 0.5 µm to 5 µm.

2. The printed wiring board according to claim 1, wherein said metal comprises at least one metal selected from the group consisting of nickel, cobalt, chromium, indium, lanthanum, lithium, tin, tantalum, platinum, iron, palladium, vanadium, titanium, and zirconium.

3. The printed wiring board according to claim 2, wherein said resistance element is formed by a nickel alloy containing from 5% to 15% phosphorus by total weight.

4. The printed wiring board according to claim 1, further comprising a protective film comprising a material having an etching resistance, said protective film being interposed between said resistance element and said conductor pattern.

5. The printed wiring board according to claim 1, wherein:
   said insulating layer comprises a first roughened insulating layer surface, and
   said resistance element comprises a first portion that substantially conforms to the first roughened insulating layer surface.

6. The printed wiring board according to claim 5, wherein said first portion includes said main portion of said resistance element.

7. The printed wiring board according to claim 5, wherein said conductor pattern comprises a roughened conductor layer surface, and
   said resistance element comprises a second portion that substantially conforms to the roughened conductor layer surface.

8. The printed wiring board according to claim 7, wherein said second portion includes said lead portion.

9. The printed wiring board according to claim 7, further comprising another insulating layer comprising a second roughened insulating layer surface substantially conforming to the first roughened insulating surface, said resistance element being interposed between and substantially conforming to each of said first and second roughened insulating layer surfaces.

10. The printed wiring board according to claim 9, wherein at least one of said insulating layer and said another insulating layer comprises a solder mask.

11. The printed wiring board according to claim 9, wherein said another insulating layer is provided adjacent to said conductor pattern, said second roughened insulating layer surface substantially conforming to said roughened conductor layer surface and said resistance element being interposed between the second roughened insulating layer surface and said roughened conductor layer surface.

12. The printed wiring board according to claim 1, wherein the resistance element is embedded within the insulating layer.

13. The printed wiring board according to claim 1, wherein said roughened surface contour of the resistance element is substantially the same contour as a roughened surface of said conductor pattern.

* * * * *